US012707775B2

(12) United States Patent
Meng et al.

(10) Patent No.: US 12,707,775 B2
(45) Date of Patent: Aug. 11, 2026

(54) DISPLAY BASEPLATES, ENCAPSULATION BASEPLATES AND DISPLAY APPARATUSES

(71) Applicants: BOE MLED Technology Co., Ltd., Beijing (CN); BOE Technology Group Co., Ltd., Beijing (CN)

(72) Inventors: Qiuhua Meng, Beijing (CN); Xiawei Yun, Beijing (CN); Chenchang Chen, Beijing (CN); Yicheng Lin, Beijing (CN); Lingyun Shi, Beijing (CN); Guofeng Hu, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 538 days.

(21) Appl. No.: 18/027,227

(22) PCT Filed: Feb. 28, 2022

(86) PCT No.: PCT/CN2022/078292

§ 371 (c)(1),
(2) Date: Mar. 20, 2023

(87) PCT Pub. No.: WO2023/159567

PCT Pub. Date: Aug. 31, 2023

(65) Prior Publication Data

US 2024/0313173 A1 Sep. 19, 2024

(51) Int. Cl.
*H10H 20/853* (2025.01)
*H10D 89/60* (2025.01)
(Continued)

(52) U.S. Cl.
CPC ......... *H10H 20/853* (2025.01); *H10D 89/811* (2025.01); *H10H 20/84* (2025.01); *H10H 20/857* (2025.01); *H10W 90/00* (2026.01)

(58) Field of Classification Search
CPC .... H10H 20/853; H10H 20/84; H10H 20/857; H10D 89/811; H01L 25/0753; H01L 25/167
See application file for complete search history.

(56) References Cited

U.S. PATENT DOCUMENTS 9,825,012 B2 * 11/2017 Hsieh ...................... H01L 24/24
11,029,544 B2 * 6/2021 Jung ................. G02F 1/133516
(Continued)

FOREIGN PATENT DOCUMENTS

CN 103700683 A 4/2014
CN 106684108 A 5/2017
(Continued)

OTHER PUBLICATIONS

PCT/CN2022/078292 international search report.
PCT/CN2022/078292 Written Opinion.

*Primary Examiner* — Jeff W Natalini
*Assistant Examiner* — Andrew John Zabel
(74) *Attorney, Agent, or Firm* — IPro, PLLC

(57) ABSTRACT

A display baseplate (100), an encapsulation baseplate (400) and a display apparatus are provided. The display baseplate (100) includes a substrate (10), a plurality of light-emitting unit groups on the substrate (10), a light-transmitting layer (20) on the substrate (10), a light-blocking layer (30) on the substrate (10), and an encapsulation cover plate (40) at a side of the light-blocking layer (30) away from the substrate (10). Each light-emitting unit group includes a plurality of light emitters (50). The light-blocking layer (30) includes a plurality of holes (31), and an orthographic projection of the light emitters (50) on the substrate (10) is within an orthographic projection of the holes (31) onto the substrate (10). The light-transmitting layer (20) covers the light emitters (50). The light-transmitting layer (20) is partially between
(Continued)

the light-blocking layer (30) and the substrate (10) and partially in the holes (31). The display apparatus includes the display baseplate (100).

13 Claims, 11 Drawing Sheets

(51) Int. Cl.

| | |
|---|---|
| ***H10H 20/84*** | (2025.01) |
| ***H10H 20/857*** | (2025.01) |
| ***H10W 90/00*** | (2026.01) |

(56) References Cited

U.S. PATENT DOCUMENTS

| | | | | |
|---|---|---|---|---|
| 2013/0292705 | A1* | 11/2013 | Makimura | H01H 57/00 257/81 |
| 2016/0149403 | A1* | 5/2016 | Ikeda | H02H 9/041 361/56 |
| 2016/0276617 | A1 | 9/2016 | Qi et al. | |
| 2016/0365391 | A1* | 12/2016 | Omata | H10K 59/122 |
| 2018/0360352 | A1* | 12/2018 | Ohno | A61B 5/1455 |
| 2019/0221728 | A1* | 7/2019 | Yu | H10H 20/8515 |
| 2020/0083280 | A1 | 3/2020 | Wu et al. | |
| 2020/0327296 | A1* | 10/2020 | Wu | G02B 3/0056 |
| 2021/0397803 | A1* | 12/2021 | Ryu | G06F 1/1684 |
| 2022/0036032 | A1* | 2/2022 | Ryu | H01L 25/167 |
| 2023/0168532 | A1 | 6/2023 | Liu | |

FOREIGN PATENT DOCUMENTS

| | | | | |
|---|---|---|---|---|
| CN | 206471334 | U | 9/2017 | |
| CN | 211293538 | U | 8/2020 | |
| CN | 112151567 | A | 12/2020 | |
| CN | 112164334 | A | 1/2021 | |
| CN | 112349745 | A | 2/2021 | |
| CN | 113160711 | A | 7/2021 | |
| CN | 113597256 | A | 11/2021 | |
| CN | 113745209 | A | 12/2021 | |
| KR | 20210123551 | A * | 10/2021 | H10H 20/855 |
| WO | 2021164108 | A1 | 8/2021 | |

* cited by examiner

200
VDD
T4
EM
T2
Date
C
Gate
T1
T3
Gate
EM
300
VGL
Reset
T6
M1
T7
M1
50
Reset
Vinit
A
VSS
M2
M2
VGH

DISPLAY BASEPLATES, ENCAPSULATION BASEPLATES AND DISPLAY APPARATUSES

CROSS-REFERENCE TO RELATED APPLICATIONS

This application is a national stage of international PCT Application No. PCT/CN2022/078292 filed on Feb. 28, 2022, the entire contents of which are incorporated herein by reference.

TECHNICAL FIELD

The present disclosure relates to the field of display technologies, and in particular to a display baseplate, an encapsulation baseplate and a display apparatus.

BACKGROUND

Mini-LED is a new LED display technology derived from small-spacing LED, which is also called sub-millimeter light-emitting diode. The grain size of Mini-LED is about 100 μm to 300 μm, namely, between the grain sizes of conventional LED and Micro LED. Due to good display effect, lightness and thinness experience, high contrast and long service life and so on, Mini-LED has obvious use tendency in the display field.

SUMMARY

The present disclosure provides a display baseplate, an encapsulation baseplate and a display apparatus.

According to a first aspect of embodiments of the present disclosure, there is provided a display baseplate, including:

a substrate;

a plurality of light-emitting unit groups on the substrate, where each of the light-emitting unit groups includes a plurality of light emitters;

a light-blocking layer on the substrate, where the light-blocking layer includes a plurality of holes, and an orthographic projection of the light emitters onto the substrate is within an orthographic projection of the holes onto the substrate;

a light-transmitting layer on the substrate, where the light-transmitting layer covers the light emitters, the light-transmitting layer is partially between the light-blocking layer and the substrate and partially in the holes; and an encapsulation cover plate at a side of the light-blocking layer away from the substrate.

In an embodiment, an orthographic projection of each of the light-emitting unit groups onto the substrate is within an orthographic projection of one of the holes onto the substrate; or, an orthographic projection of each of the light emitters onto the substrate is within an orthographic projection of one of the holes onto the substrate.

In an embodiment, a thickness of the light-transmitting layer is greater than or equal to a thickness of the light-blocking layer.

In an embodiment, an orthographic projection of the light-transmitting layer onto the substrate covers an orthographic projection of the light-blocking layer onto the substrate.

In an embodiment, the light-transmitting layer includes a first light-transmitting film layer and a second light-transmitting film layer at a side of the first light-transmitting film layer away from the substrate, the second light-transmitting film layer fills the holes, and a light transmittance of the second light-transmitting film layer is less than a light transmittance of the first light-transmitting film layer; and an orthographic projection of the second light-transmitting film layer onto the substrate covers the orthographic projection of the light emitters onto the substrate.

In an embodiment, a thickness of the second light-transmitting film layer is greater than or equal to a thickness of the light-blocking layer.

In an embodiment, the display baseplate further includes one or more support columns inside the light-transmitting layer, where an end of the support columns away from the substrate abuts the light-blocking layer; and an orthographic projection of the support columns onto the substrate is within an orthographic projection of the light-blocking layer onto the substrate.

In an embodiment, the light-blocking layer includes a conductive layer, the display baseplate further includes a power supply signal line on the substrate, and the conductive layer is electrically connected with the power supply signal line.

In an embodiment, the display baseplate further includes one or more support columns inside the light-transmitting layer, where at least one of the support columns includes a conductive material, and an end of the at least one support column away from the substrate abuts the light-blocking layer; and the conductive layer is connected with the power supply signal line through the at least one support column.

In an embodiment, the display baseplate further includes one or more connection structures on the substrate, where the light emitters include respective first electrodes, the connection structures are configured to connect the first electrodes with the power supply signal line, and the support columns are lapped with the connection structures.

In an embodiment, the light-blocking layer includes a conductive layer, the display baseplate further includes one or more electrostatic protection circuits on the substrate, and the conductive layer is electrically connected with the electrostatic protection circuits.

In an embodiment, the display baseplate further includes one or more support columns inside the light-transmitting layer, where the support columns include a conductive material, and an end of the support columns away from the substrate abuts the light-blocking layer; and the conductive layer is connected with the electrostatic protection circuits through the support columns.

In an embodiment, the display baseplate further includes one or more connection structures on the substrate, where the light emitters include respective first electrodes, the connection structures are configured to connect the first electrodes with the electrostatic protection circuits, and the support columns are lapped with the connection structures.

In an embodiment, the display baseplate further includes one or more pixel circuits and one or more connection wires at a side of the pixel circuits away from the substrate, where the light emitters include respective second electrodes, the connection wires connect the second electrodes with the pixel circuits; and the connection wires and the connection structures are in a same layer. In an embodiment, the display baseplate further includes one or more electrostatic protection circuits on the substrate, where each of the light emitters is electrically connected with one of the electrostatic protection circuits.

In an embodiment, each of the electrostatic protection circuits includes one or more thin film transistors, and the thin film transistors of adjacent electrostatic protection circuits are series-connected with each other.

In an embodiment, the light-blocking layer includes a conductive layer and a light adjustment layer at a side of the conductive layer away from the substrate, and an orthographic projection of the conductive layer onto the substrate is within an orthographic projection of the light adjustment layer onto the substrate.

In an embodiment, the light-transmitting layer includes a first light-transmitting film layer and a second light-transmitting film layer at a side of the first light-transmitting film layer away from the substrate, the second light-transmitting film layer fills the holes, and a light transmittance of the second light-transmitting film layer is less than a light transmittance of the first light-transmitting film layer; and a ratio between a thickness of the light adjustment layer and a thickness of the second light-transmitting film layer is in a range of 1:1 to 1:2.

In an embodiment, when an orthographic projection of each of the light-emitting unit groups onto the substrate is within an orthographic projection of one of the holes onto the substrate, a thickness of the light adjustment layer is a first thickness; when an orthographic projection of each of the light emitters onto the substrate is within an orthographic projection of one of the holes onto the substrate, a thickness of the light adjustment layer is a second thickness; and the first thickness is greater than the second thickness.

In an embodiment, a distance between an edge of the orthographic projection of the conductive layer onto the substrate and an edge of the orthographic projection of the light adjustment layer onto the substrate is in a range of 1 μm to 5 μm; and/or, a thickness of the light adjustment layer is in a range of 1.5 μm to 3 μm.

In an embodiment, the light-transmitting layer includes a plurality of light-transmitting portions, and each of the light-transmitting portions wraps two or more of the light emitters in one of the light-emitting unit groups.

In an embodiment, the display baseplate further includes scattering particles dispersed in the light-transmitting layer.

According to a second aspect of embodiments of the present disclosure, there is provided an encapsulation baseplate, including:

an encapsulation cover plate;

a light-blocking layer at a side of the encapsulation cover plate, where the light-blocking layer includes a plurality of holes;

a light-transmitting layer at a side of the encapsulation cover plate, where the light-transmitting layer covers the light-blocking layer and a portion of the light-transmitting layer is in the holes.

In an embodiment, the light-transmitting layer includes a first light-transmitting film layer and a second light-transmitting film layer at a side of the first light-transmitting film layer facing the encapsulation cover plate, the second light-transmitting film layer fills the holes, and a light transmittance of the second light-transmitting film layer is less than a light transmittance of the first light-transmitting film layer; and/or, the encapsulation baseplate further includes scattering particles dispersed in the light-transmitting layer.

In an embodiment, the encapsulation baseplate further includes one or more support columns inside the light-transmitting layer, where an end of the support columns facing the encapsulation cover plate abuts the light-blocking layer; and an orthographic projection of the support columns onto the encapsulation cover plate is within an orthographic projection of the light-blocking layer onto the encapsulation cover plate.

In an embodiment, the light-blocking layer includes a conductive layer, the support columns include a conductive material, and the support columns are electrically connected with the conductive layer.

In an embodiment, the light-blocking layer includes a light adjustment layer and a conductive layer at a side of the light adjustment layer away from the encapsulation cover plate, and an orthographic projection of the conductive layer onto the encapsulation cover plate is within an orthographic projection of the light adjustment layer onto the encapsulation cover plate;

a distance between an edge of the orthographic projection of the conductive layer onto the encapsulation cover plate and an edge of the orthographic projection of the light adjustment layer onto the encapsulation cover plate is in a range of 1 μm to 5 μm; and/or, a thickness of the light adjustment layer is in a range of 1.5 μm to 3 μm; and/or, a thickness of the conductive layer is in a range of 300 nm to 1000 nm; and/or, the light-transmitting layer includes a first light-transmitting film layer and a second light-transmitting film layer at a side of the first light-transmitting film layer facing the encapsulation cover plate, the second light-transmitting film layer fills the holes, and a light transmittance of the second light-transmitting film layer is less than a light transmittance of the first light-transmitting film layer; a ratio between the thickness of the light adjustment layer and a thickness of the second light-transmitting film layer is in a range of 1:1 to 1:2.

According to a third aspect of embodiments of the present disclosure, there is provided a display apparatus including the above display baseplate.

In display baseplates, encapsulation baseplates and display apparatuses provided by the embodiments of the present disclosure, a light-blocking layer includes a plurality of holes; an orthographic projection of light emitters onto a substrate is within an orthographic projection of the holes onto the substrate; a light-transmitting layer covers the light emitters; and a light transmittance of the light-transmitting layer is greater than a light transmittance of the light-blocking layer. In this case, light emitted by the light emitters can be emitted through a part of the light-transmitting layer filled in the holes. Compared with the solution in which the light-blocking layer covers the light emitters, in the embodiments of the present disclosure, the problem that a large working current of the display baseplate results from the low light transmittance of the light-blocking layer, further leading to high power consumption and high working temperature of the display baseplate, can be avoided; and the part of the light-transmitting layer in the holes can reduce a reflective index of environmental light incident to the display baseplate, thus ensuring the display effect of the display baseplate.

DETAILED DESCRIPTION OF THE EMBODIMENTS

Figure 1A:
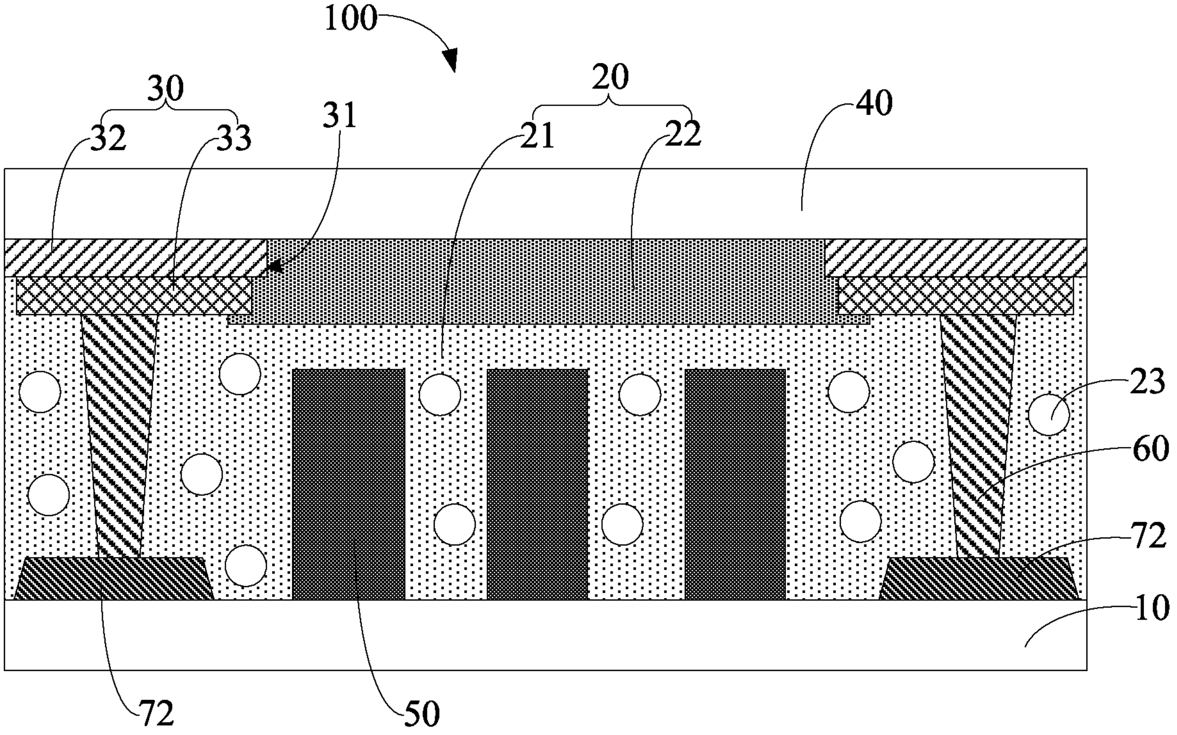
FIG. 1A is a partial sectional view of a display baseplate according to an exemplary embodiment of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although the terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, the second information may also be referred as the first information. Depending on the context, the term "if" as used herein may be interpreted as "when" or "upon" or "in response to determining".

Embodiments of the present disclosure provide a display baseplate, an encapsulation baseplate and a display apparatus. The display baseplate, the encapsulation baseplate and the display apparatus of the embodiments of the present disclosure will be detailed below in combination with accompanying drawings. In a case of no conflicts, the features of the following embodiments can be mutually supplemented or combined.

Figure 1B:
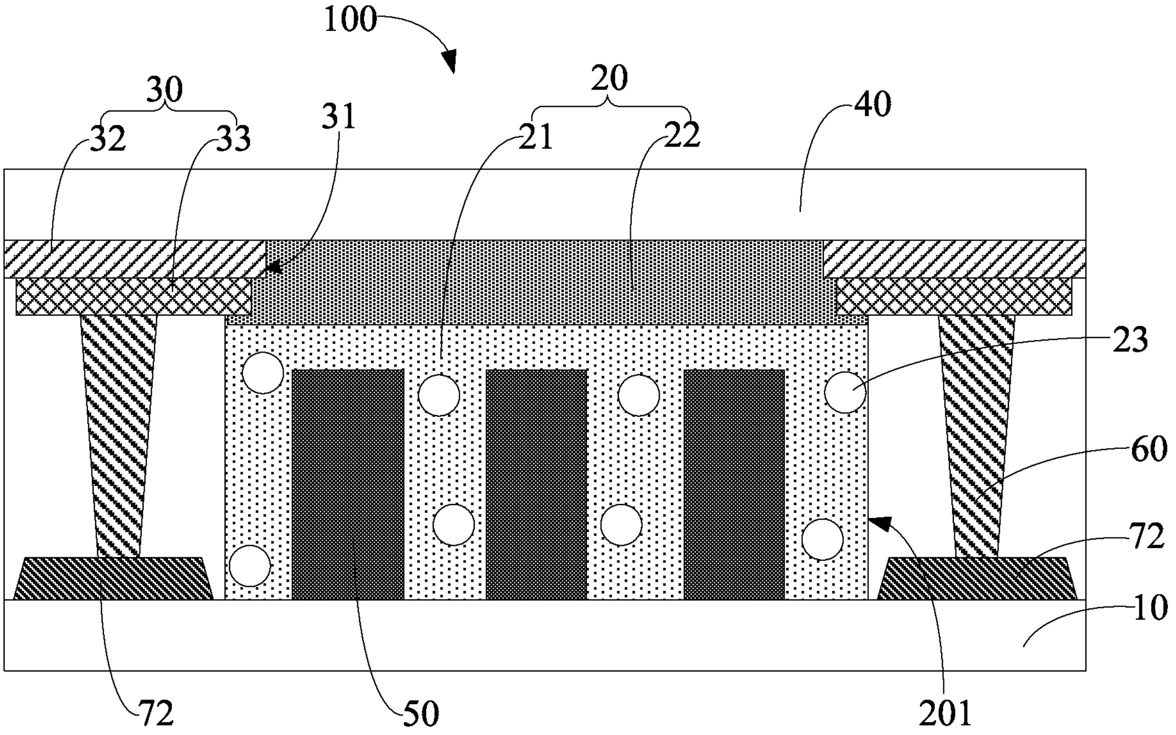
FIG. 1B is a partial sectional view of a display baseplate according to another exemplary embodiment of the present disclosure.
Figure 2:
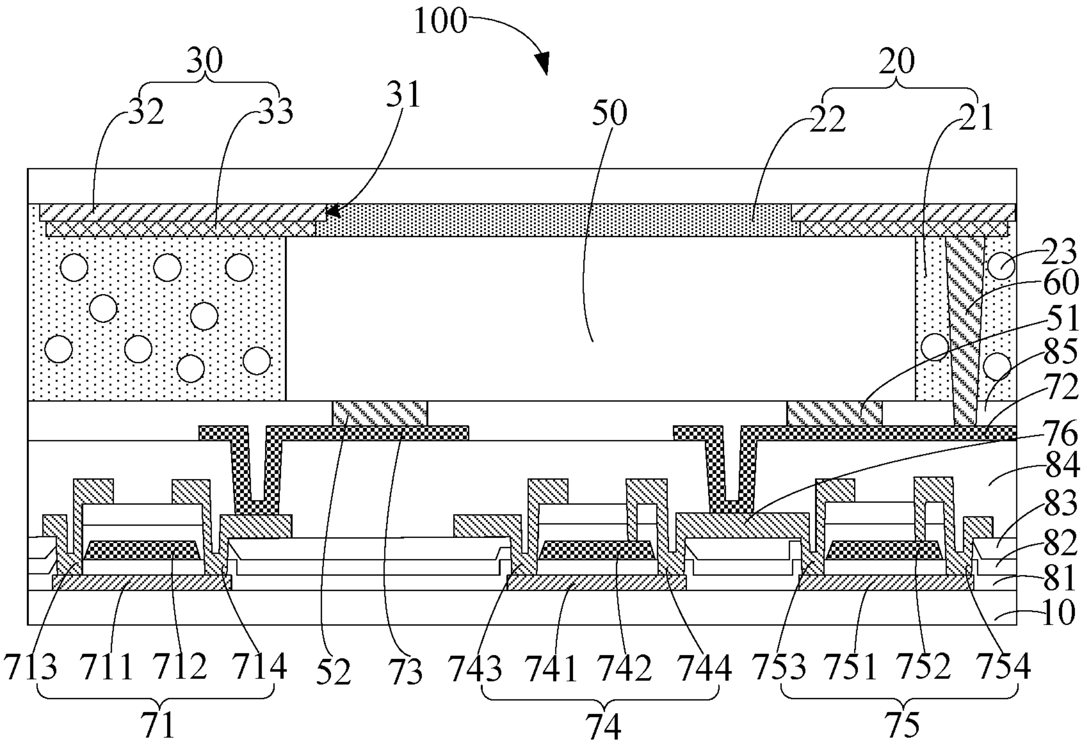
FIG. 2 is a partial sectional view of a display baseplate according to yet another exemplary embodiment of the present disclosure.

Embodiments of the present disclosure provide a display baseplate. As shown in FIGS. 1A, 1B and 2, a display baseplate 100 includes a substrate 10, a plurality of light-emitting unit groups located on the substrate 10, a light-transmitting layer 20 located on the substrate 10, a light-blocking layer 30 located on the substrate 10, and an encapsulation cover plate 40 located at a side of the light-blocking layer 30 away from the substrate 10.

Each of the light-emitting unit groups include a plurality of light emitters 50. The light-blocking layer 30 is provided with a plurality of holes 31, and an orthographic projection of the light emitters 50 on the substrate 10 is located within an orthographic projection of the holes 31 on the substrate 10. The light-transmitting layer 20 covers the light emitters 50, and the light-transmitting layer 20 is partially located between the light-blocking layer 30 and the substrate 10 while partially filled in the holes 31.

In the display baseplate provided by the embodiments of the present disclosure, the light-blocking layer 30 is provided with a plurality of holes 31; the orthographic projection of the light emitters 50 on the substrate 10 is located within the orthographic projection of the holes 31 on the substrate 10; the light-transmitting layer 20 covers the light emitters 50; and a light transmittance of the light-transmitting layer 20 is greater than a light transmittance of the light-blocking layer 30. In this case, light emitted by the light emitters 50 can be emitted through a part of the light-transmitting layer 20 filled in the holes 31. Compared with the solution in which the light-blocking layer covers the light emitters 50, in the embodiments of the present disclosure, the problem that a large working current of the display baseplate results from the low light transmittance of the light-blocking layer, further leading to high power consumption and high working temperature of the display baseplate, can be avoided; and the part of the light-transmitting layer 20 in the holes 31 can reduce a reflective index of environmental light incident to the display baseplate, thus ensuring the display effect of the display baseplate.

In an embodiment, a surface of the light-blocking layer 30 away from the substrate 10 is substantially flushed with a surface of the light-transmitting layer 20 away from the substrate 10 and both of the surfaces are in contact with the encapsulation cover plate 40. Hence, a surface of the display baseplate has good flatness.

In an embodiment, a thickness of the light-transmitting layer 20 is greater than or equal to a thickness of the light-blocking layer 30.

In an embodiment, an orthographic projection of the light-transmitting layer 20 on the substrate 10 covers an orthographic projection of the light-blocking layer 30 on the substrate 10. As shown in FIG. 1A, the light-transmitting layer 20 is a complete surface of film layer.

In an embodiment, as shown in FIG. 1B, the light-transmitting layer 20 includes a plurality of light-transmitting portions 201, and each of the light-transmitting portions 201 wraps two or more of the light emitters 50 in one of the light-emitting unit groups.

In an embodiment, there may be a gap between adjacent light-transmitting portions 201. The gap between adjacent light-transmitting portions 201 may be filled with a transparent material or no material is filled between adjacent light-transmitting portions 201.

In an embodiment, during preparing the display baseplate shown in FIG. 1B, the light emitters 50 may be firstly bound to the substrate 10, where a plurality of light emitters 50 in a same light-emitting unit group are disposed adjacently; next, a plurality of light-transmitting portions 201 are formed on the substrate 10, where each of the light-transmitting portions 201 wraps a plurality of light emitters in one light-emitting unit group; next, the light-blocking layer 30 is formed.

In another embodiment, during preparing the display baseplate shown in FIG. 1B, the light emitters 50 may be firstly bound to a baseplate, where a plurality of light emitters 50 in a same light-emitting unit group are disposed adjacently on the baseplate; next, a plurality of light-transmitting portions 201 are formed on the baseplate, where for each of the light-transmitting portions 201, the light-transmitting portion 201 wraps a plurality of light emitters in one light-emitting unit group, and the light-transmitting portion and the plurality of light emitters wrapped by the light-transmitting portion form one encapsulation element; next, respective encapsulation elements are transferred to the substrate 10, and light emitters of the respective encapsulation elements are bound to the substrate 10; next, the light-blocking layer 30 is formed.

In an embodiment, the substrate 10 may be a flexible substrate or a rigid substrate. The flexible substrate may be made of one or more of polyimide, polyethylene terephthalate or polycarbonate, and the rigid substrate may be made of glass, silicon or the like.

In an embodiment, the light-emitting unit group includes a plurality of light emitters 50 with different luminous colors. For example, the light-emitting unit group includes one or more light emitters with red luminous color, one or more light emitters with green luminous color, and one or more light emitters with blue luminous color. The light-emitting unit group may serve as one pixel. In another embodiment, for a plurality of light emitters included in the light-emitting unit group, some or all of the light emitters may have a same luminous color.

In an embodiment, the light emitters 50 may be Mini LEDs or Micro LEDs.

In an embodiment, the light-blocking layer 30 includes a light adjustment layer 32, where a light transmittance of the light adjustment layer 32 is less than a light transmittance of the light-transmitting layer 20. The light adjustment layer 32 can effectively reduce a reflective index of environmental light incident to the display baseplate. The light adjustment layer 32 may be a black film layer and the light-transmitting layer 20 may be a grey film layer. The light-transmitting layer 20 may have adhesivity, for example, the light-transmitting layer 20 may be a grey resin. The light-transmitting layer 20 may be configured to bond the encapsulation cover plate 40 and the substrate 10 together. The grey resin may be obtained by doping a transparent material such as a resin material with a carbon black material, where a light transmittance of the light-transmitting layer 20 can be adjusted by controlling an amount of the doped carbon black material.

In an embodiment, the light transmittance of the light adjustment layer 32 may be less than 5%. The light adjustment layer 32 may be made of a material comprising a photoresist material, for example, a positive photoresist material, or a negative photoresist material.

In an embodiment, a thickness of the light adjustment layer 32 is in a range of 1.5 μm to 3 μm. With this disposal, poor light-blocking effect of the light adjustment layer 32 resulting from too small thickness of the light adjustment layer 32 can be avoided and meanwhile, the problem that an increased thickness of the display baseplate resulting from too large thickness of the light adjustment layer 32 is unfavorable for the lightness and thinness of the display baseplate can also be avoided. The thickness of the light adjustment layer 32 may be, for example, 1.5 μm, 1.8 μm, 2.0 μm, 2.2 μm, 2.5 μm, 2.8 μm, 3 μm or the like.

In an embodiment, the light-blocking layer 30 may further include a conductive layer 33, and the light adjustment layer 32 is located at a side of the conductive layer 33 away from the substrate 10. The disposal of the conductive layer 33 can further reduce the light transmittance of the light-blocking layer 30.

In an embodiment, an orthographic projection of the conductive layer 33 on the substrate 10 is located within an orthographic projection of the light adjustment layer 32 on the substrate 10. With this disposal, the problem that reflection of external environmental light incident to an edge of the conductive layer 33 which is exposed out of the light adjustment layer 32 is unfavorable for improvement of the display effect of the display baseplate can be avoided. The orthographic projection of the conductive layer 33 on the substrate 10 is located within the orthographic projection of the light adjustment layer 32 on the substrate 10, which means that an edge of the orthographic projection of the conductive layer 33 on the substrate 10 is located at an inner side of an edge of the orthographic projection of the light adjustment layer 32 on the substrate 10, or, the edge of the orthographic projection of the conductive layer 33 on the substrate 10 is substantially coincident with the edge of the orthographic projection of the light adjustment layer 32 on the substrate 10. The conductive layer 33 and the light adjustment layer 32 may be same in shape, and the conductive layer 33 has a smaller area than that of the light adjustment layer 32.

In an embodiment, a distance between the edge of the orthographic projection of the conductive layer 33 on the substrate 10 and the edge of the orthographic projection of the light adjustment layer 32 on the substrate 10 is 1 μm to 5 μm. With this disposal, the problem that environmental light incident to the edge of the conductive layer 33 can be reflected due to small distance between the edge of the orthographic projection of the conductive layer 33 on the substrate 10 and the edge of the orthographic projection of the light adjustment layer 32 on the substrate 10 can be avoided and meanwhile, the problem that the conductive layer 33 has small area and large resistance due to large distance between the edge of the orthographic projection of the conductive layer 33 on the substrate 10 and the edge of the orthographic projection of the light adjustment layer 32 on the substrate 10, which is unfavorable for reduction of a resistance of a subsequent power supply signal line, can be avoided. In some embodiments, the distance between the edge of the orthographic projection of the conductive layer 33 on the substrate 10 and the edge of the orthographic projection of the light adjustment layer 32 on the substrate 10 may be 1 μm, 2 μm, 3 μm, 4 μm, 5 μm or the like.

In an embodiment, the conductive layer 33 has a light transmittance of less than 5% and a reflective index of less than 80%. With this disposal, crosstalk due to reflection of light of different light emitters 50 by the conductive layer 33 can be avoided.

In an embodiment, the conductive layer 33 may be made of at least one of a metal molybdenum or a metal copper. In an embodiment, the conductive layer 33 may include a plurality of sub-film layers, for example, the conductive layer 33 includes two layers of metal titanium film layers and a metal aluminum film layer between the two layers of metal titanium film layers, or the conductive layer 33 includes two layers of metal molybdenum film layers and a metal aluminum film layer between the two layers of metal molybdenum film layers, or, the conductive layer 33 includes a metal molybdenum or molybdenum alloy film layer, a transparent conductive film layer and a metal copper film layer between the metal molybdenum or molybdenum alloy film layer and the transparent conductive film layer.

In an embodiment, as shown in FIGS. 1A and 1B, for each of the light-emitting unit groups, an orthographic projection of the light-emitting unit group on the substrate 10 is located within an orthographic projection of one of the holes 31 on the substrate 10. The light-emitting unit groups are in one-to-one correspondence with the holes 31. For each of the light emitters 50 in each light-emitting unit group, an orthographic projection of the light emitter 50 on the substrate 10 is located within an orthographic projection of a corresponding hole 31 on the substrate 10. In this embodiment, a size of the holes 31 of the light-blocking layer 30 is large, and a transmittance of the light emitted by the light emitters 50 is high and may reach above 70%; further, low requirements are made for the preparation precision of the light-blocking layer.

In another embodiment, as shown in FIG. 2, for each of the light emitters 50, an orthographic projection of the light emitter 50 on the substrate 10 is located within an orthographic projection of one of the holes 31 on the substrate 10. The light emitters 50 are in one-to-one correspondence with the holes 31. For each of the light emitters 50, an orthographic projection of the light emitter 50 on the substrate 10 is located within an orthographic projection of a corresponding hole 31 on the substrate 10. With this disposal, the light-blocking layer 30 can cover a region between adjacent light emitters 50 to help avoid crosstalk occurring to the light emitted by adjacent light emitters 50. In this way, the display baseplate has a high display contrast, thus helping improve the display effect. Further, the light transmittance of the display baseplate can reach above 50%.

In an embodiment, when for each of the light-emitting unit groups, an orthographic projection of the light-emitting unit group on the substrate 10 is located within an orthographic projection of one of the holes 31 on the substrate 10, the thickness of the light adjustment layer 32 is a first thickness; when for each of the light emitters 50, an orthographic projection of the light emitter 50 on the substrate 10 is located within an orthographic projection of one of the holes 31 on the substrate 10, the thickness of the light adjustment layer 32 is a second thickness; where the first thickness is greater than the second thickness. That is, when the size of the holes 31 is large, the thickness of the light adjustment layer 32 is large and can effectively reduce the reflective index of the environmental light; when the size of the holes 31 is small, the light adjustment layer 32 has a large area and a small thickness, and thus can increase its light transmittance.

Figure 3:
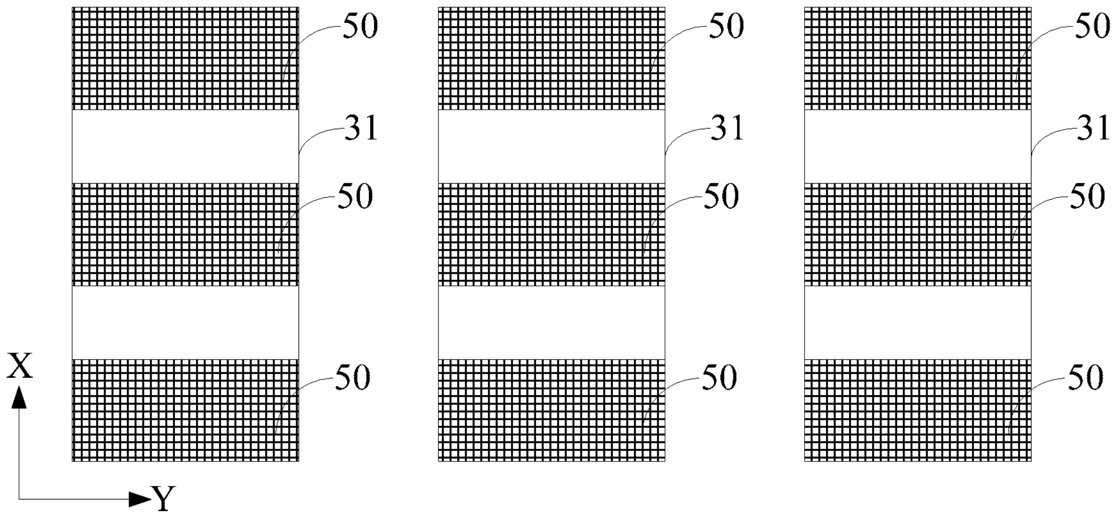
FIG. 3 is a partial structural schematic diagram of light emitters and a light-blocking layer of a display baseplate according to an exemplary embodiment of the present disclosure.
Figure 4:
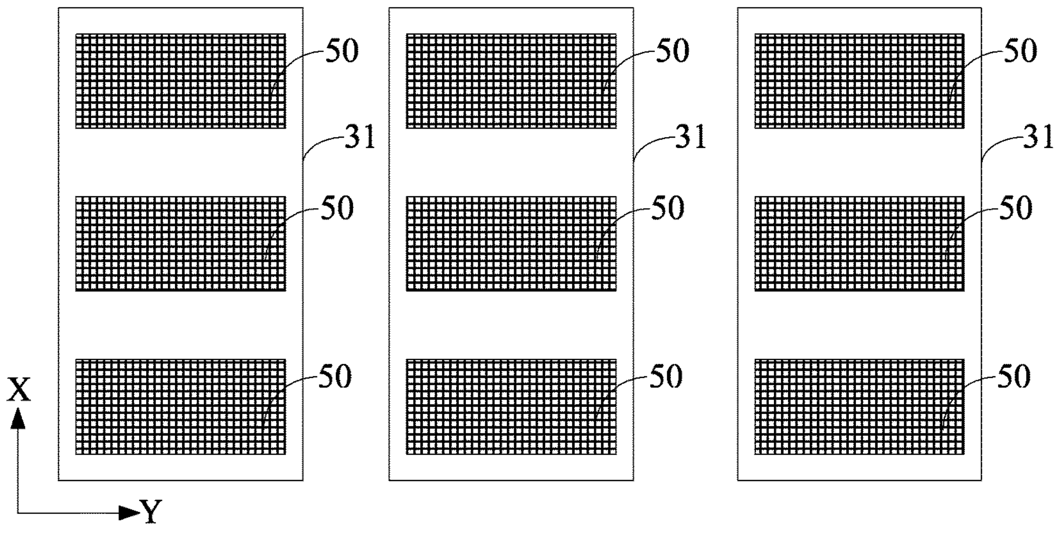
FIG. 4 is a partial structural schematic diagram of light emitters and a light-blocking layer of a display baseplate according to another exemplary embodiment of the present disclosure.
Figure 5:
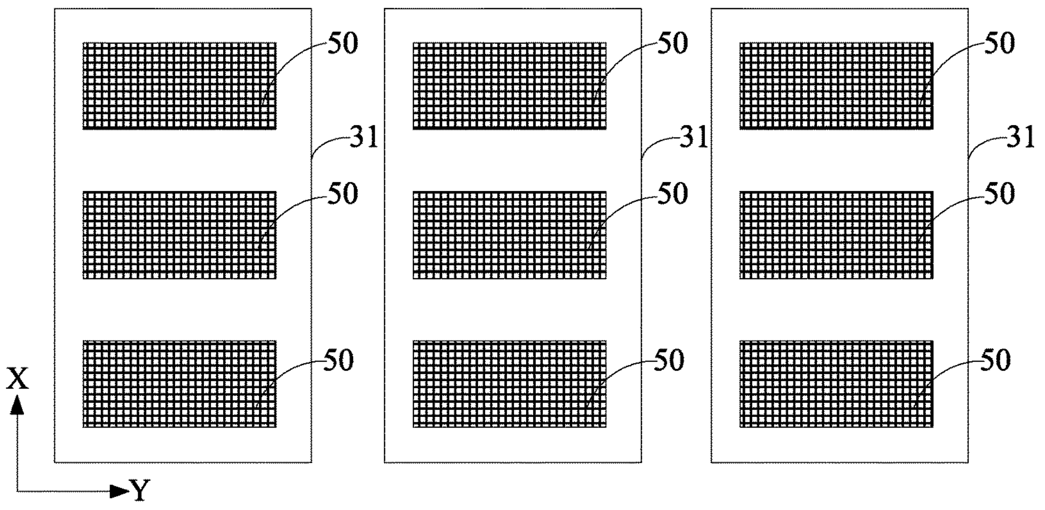
FIG. 5 is a partial structural schematic diagram of light emitters and a light-blocking layer of a display baseplate according to yet another exemplary embodiment of the present disclosure.

In embodiments of the present disclosure, several display baseplates shown in FIGS. 3 to 6 are tested and compared. In the display baseplates shown in FIGS. 3 to 6, each light-emitting unit group includes three light emitters 50. In the embodiments shown in FIGS. 3 to 5, for each of the light-emitting unit groups, an orthographic projection of the light-emitting unit group on the substrate 10 is located within an orthographic projection of one of the holes 31 on the substrate 10. In the embodiment shown in FIG. 3, a size of the light-emitting unit group along a first direction X is substantially same as a size of a corresponding hole 31 along the first direction X, and a size of the light-emitting unit group along a second direction Y is substantially same as a size of the corresponding hole 31 along the second direction Y, where the first direction X is perpendicular to the second direction Y. In the embodiments shown in FIGS. 4 and 5, a size of the light-emitting unit group along the first direction X is less than a size of a corresponding hole 31 along the first direction X, and a size of the light-emitting unit group along the second direction Y is less than a size of the corresponding hole 31 along the second direction Y. Further, the size of the hole 31 along the first direction X as shown in FIG. 4 is less than the size of the hole 31 along the first direction X as shown in FIG. 5, and the size of the hole 31 along the second direction Y as shown in FIG. 4 is less than the size of the hole 31 along the second direction Y as shown in FIG. 5. In the embodiment shown in FIG. 6, for each of the light emitters 50, an orthographic projection of the light emitter 50 on the substrate 10 is located within an orthographic projection of one of the holes 31 on the substrate 10, and a size of the light emitter 50 is substantially same as a size of a corresponding hole 31.

Figure 6:
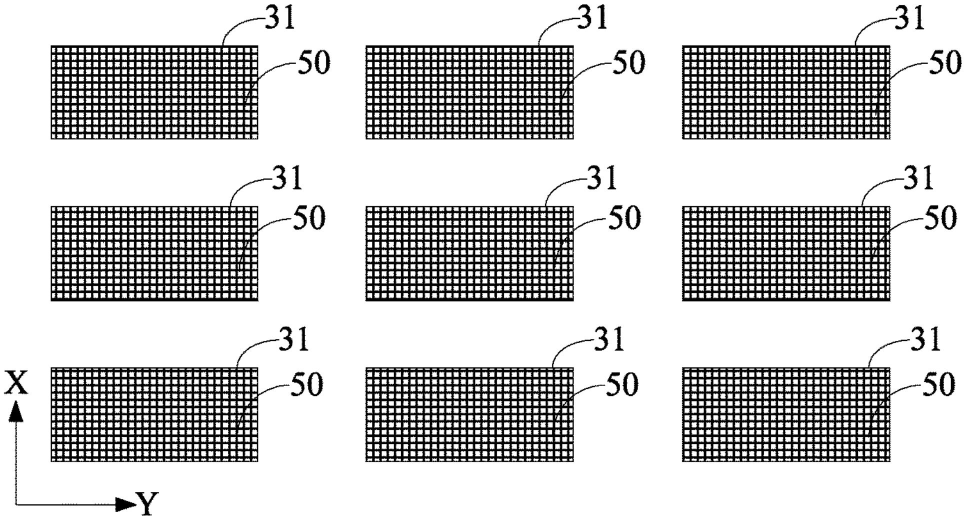
FIG. 6 is a partial structural schematic diagram of light emitters and a light-blocking layer of a display baseplate according to yet another exemplary embodiment of the present disclosure.

Based on test on the display baseplates shown in FIGS. 3 to 6, it is found that light crosstalk occurs to adjacent light emitters of the display baseplates shown in FIGS. 3 to 5 but light transmittances of the display baseplates shown in FIGS. 3 to 5 are all greater than that of the display baseplate shown in FIG. 6, where a light transmittance of the display baseplate shown in FIG. 3 is less than a light transmittance of the display baseplate shown in FIG. 4, and the light transmittance of the display baseplate shown in FIG. 4 is less than a light transmittance of the display baseplate shown in FIG. 5. The light crosstalk of the display baseplate shown in FIG. 6 is significantly reduced relative to the display baseplates shown in FIGS. 3 to 5, but the light transmittance of the display baseplate shown in FIG. 6 is lower than the light transmittances of the display baseplates shown in FIGS. 3 to 5.

In an embodiment, as shown in FIGS. 1A, 1B and 2, the light-transmitting layer 20 includes a first light-transmitting film layer 21 and a second light-transmitting film layer 22 located at a side of the first light-transmitting film layer 21 away from the substrate 10. The second light-transmitting film layer 22 fills the holes 31, and a light transmittance of the second light-transmitting film layer 22 is less than a light transmittance of the first light-transmitting film layer 21. An orthographic projection of the second light-transmitting film layer 22 on the substrate 10 covers the orthographic projection of the light emitters 50 on the substrate 10, and a surface of the light emitters 50 away from the substrate 10 may be in contact with the second light-transmitting film layer 22. The light emitted by the light emitters 50 can be emitted through the second light-transmitting film layer 22. Since the light transmittance of the second light-transmitting film layer 22 is less than the light transmittance of the first light-transmitting film layer 21, the reflective index of the external environmental light incident to the second light-transmitting film layer 22 is low, thus helping reduce the reflective index of the environmental light. In other embodiments, a part of the light-transmitting layer 20 in the holes 31 and a part of the light-transmitting layer 20 between the holes 31 and the substrate 10 are same in material, that is, the light transmittance of the light-transmitting layer 20 is always consistent anywhere.

Furthermore, as shown in FIGS. 1A and 1B, when the orthographic projection of each light-emitting unit group on the substrate 10 is located within the orthographic projection of one hole 31 on the substrate 10, the light-transmitting layer 20 includes a first light-transmitting film layer 21 and a second light-transmitting film layer 22 located at a side of the first light-transmitting film layer 21 away from the substrate 10. With this disposal, the display effect of the display baseplate can be improved better. When the orthographic projection of each light emitter 50 on the substrate 10 is located within the orthographic projection of one hole 31 on the substrate 10, the light transmittance of the light-transmitting layer 20 is always consistent anywhere.

In an embodiment, the second light-transmitting film layer 22 may cover the light emitters 50, or there is a gap between the second light-transmitting film layer 22 and the light emitters 50.

In an embodiment, a thickness of the second light-transmitting film layer 22 is greater than or equal to the thickness of the light-blocking layer 30. In this case, the large thickness of the second light-transmitting film layer 22 can help reduce the reflective index of the environmental light incident to the display baseplate and improve the display effect of the display baseplate. In the embodiments shown in FIGS. 1A, 1B and 2, the thickness of the second light-transmitting film layer 22 is greater than the thickness of the light-blocking layer 30.

In an embodiment, the light transmittance of the second light-transmitting film layer 22 is greater than or equal to 40%, and the second light-transmitting film layer 22 may be made of a material comprising a photoresist material, for example, a positive photoresist material or a negative photoresist material.

In an embodiment, the display baseplate 100 further includes scattering particles 23 dispersed in the light-transmitting layer 20. The scattering particles 23 can intensify the scatter of the light emitted by the light emitters, and increase the display view angle of the display baseplate. The scattering particles 23 may be $TiO_2$ nanoparticles, $SiO_2$ nanoparticles or the like. The color of the first light-transmitting film layer 21 may change along with the color of the doped scattering particles 23.

Moreover, when the light-transmitting layer 20 includes the first light-transmitting film layer 21 and the second light-transmitting film layer 22, the scattering particles 23 can be almost all dispersed in the first light-transmitting film layer 21.

In an embodiment, when the display baseplate is the display baseplate shown in FIG. 1B, the first light-transmitting film layer 21 may include light-transmitting portions 201. In an embodiment, the first light-transmitting film layer 21 may only include the light-transmitting portions 201. Before the light-transmitting portions 201 are formed, the scattering particles 23 may be doped in the material of the light-transmitting portions 201.

In an embodiment, as shown in FIGS. 1A, 1B and 2, the display baseplate 100 further includes one or more support columns 60 disposed inside the light-transmitting layer 20, and an end of the support columns 60 away from the substrate 10 abuts the light-blocking layer 30. In this case, the support columns 60 can achieve supporting effect on the encapsulation cover plate 40, such that the display baseplate will be structurally more stable. Further, based on the size of the light emitter, a height and a width of the support column 60 can be adjusted. Along a direction pointing to the encapsulation cover plate 40 from the substrate 10, a cross section area of the support column 60 can be gradually increased.

In an embodiment, an orthographic projection of the support columns 60 on the substrate 10 is located within the orthographic projection of the light-blocking layer on the substrate 10. In this case, reflection of external environmental light incident on the support columns 60 can be avoided so as to help improve the display effect of the display baseplate. Furthermore, the support columns 60 will not occupy additional space, thus helping improve the density of the light emitters of the display baseplate.

In an embodiment, the display baseplate 100 is provided with a plurality of support columns 60 which are uniformly arranged in a spacing. In this case, the support columns 60 can achieve better supporting effect on the display baseplate.

In some embodiments, the number of the light-emitting unit groups between two adjacent support columns 60 is 10 to 100. In this case, the problem of poor supporting effect due to less support columns and increased costs of the display baseplate due to more support columns can be avoided.

In an embodiment, when the display baseplate is the display baseplate shown in FIG. 1B, a gap between the light-transmitting portion 201 and the support column 60 can be filled with a transparent material or no material is filled in the gap between the light-transmitting portion 201 and the support column 60.

In an embodiment, a ratio between a thickness of the light adjustment layer 32 and a thickness of the second light-transmitting film layer 22 is in a range of 1:1 to 1:2. In this case, the blocking effect of the light adjustment layer 32 on the light emitted by the light emitters 50 can be ensured, so as to prevent occurrence of light crosstalk between the light emitters. Further, the proper thickness of the second light-transmitting film layer 22 allows a high light transmittance for the light of the light emitters while the reflection of the environmental incident light is effectively avoided. In some embodiments, the ratio between the thickness of the light adjustment layer 32 and the thickness of the second light-transmitting film layer 22 may be 1:1, 1:1.2, 1:1.4, 1:1.6, 1:1.8, 1:2 or the like.

In an embodiment, the encapsulation cover plate 40 may be a rigid cover plate or a flexible cover plate. The rigid cover plate may be made of, for example, glass, and the flexible cover plate may be made of one or more of polyimide, polyethylene terephthalate or polycarbonate.

In an embodiment, as shown in FIG. 2, the display baseplate may further include a drive circuit layer which is located between the substrate 10 and the light emitters 50. The light emitter 50 includes a first electrode and a second electrode, and the drive circuit layer includes one or more pixel circuits and a signal line connected with the drive circuit layer. The pixel circuits may be in one-to-one correspondence with the light emitters, and the second electrode of each light emitter may be electrically connected with a corresponding pixel circuit.

Figure 7:
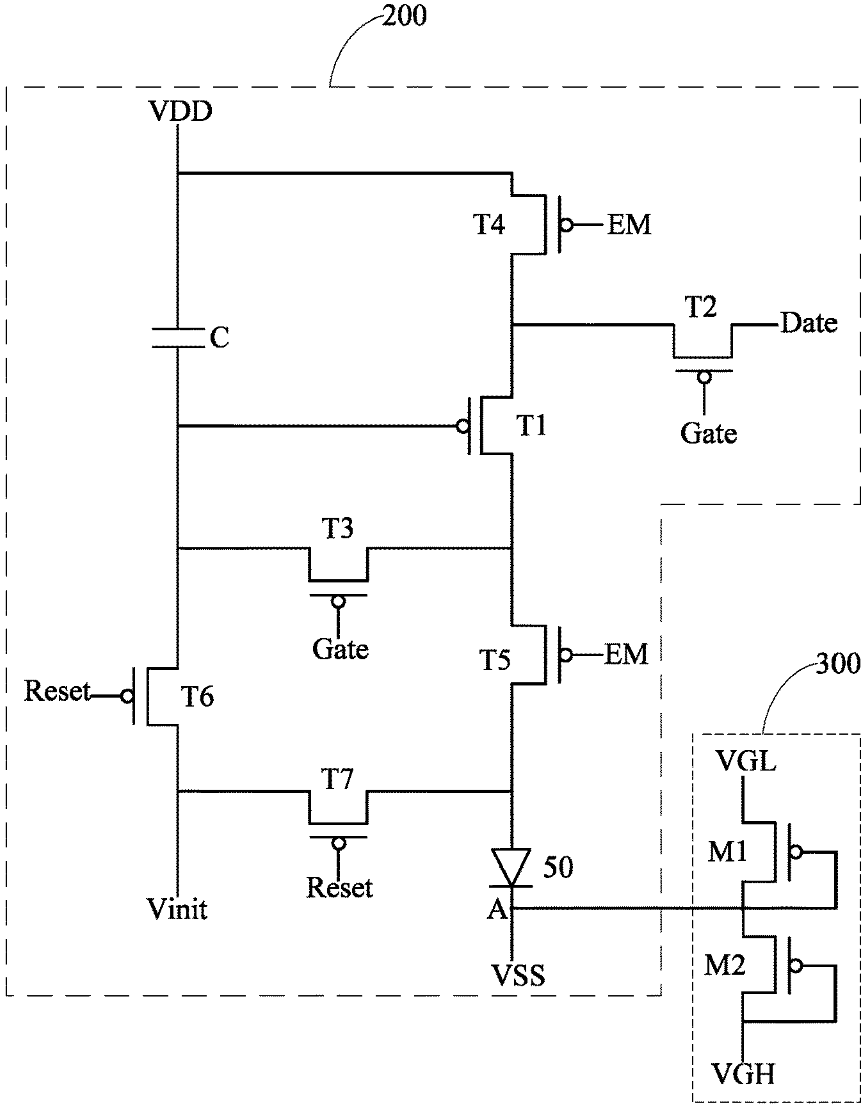
FIG. 7 is a schematic diagram illustrating a pixel circuit and an electrostatic protection circuit of a display baseplate according to an exemplary embodiment of the present disclosure.

In an embodiment, as shown in FIG. 7, a pixel circuit 200 includes a capacitor C, a drive transistor T1, a data write transistor T2, a threshold compensation transistor T3, a first light-emitting control transistor T4, a second light-emitting control transistor T5, a first reset transistor T6 and a second reset transistor T7.

A first electrode of the data write transistor T2 is electrically connected with a first electrode of the drive transistor T1, a second electrode of the data write transistor T2 is configured to be electrically connected with a data line Data to receive a data signal, and a gate electrode of the data write transistor T2 is configured to be electrically connected with a scan signal line Gate to receive a scan signal. A first electrode of the capacitor C is electrically connected with a power supply signal line VDD, and a second electrode of the capacitor C is electrically connected with a gate electrode of the drive transistor T1. A first electrode of the threshold compensation transistor T3 is electrically connected with a second electrode of the drive transistor T1, a second electrode of the threshold compensation transistor T3 is electrically connected with the gate electrode of the drive transistor T1, and a gate electrode of the threshold compensation transistor T3 is configured to be electrically connected with the scan signal line Gate to receive a compensation control signal. A first electrode of the first reset transistor T6 is configured to be electrically connected with a reset power supply signal line Vinit to receive a reset signal, a second electrode of the first reset transistor T6 is electrically connected with the gate electrode of the drive transistor T1, and a gate electrode of the first reset transistor T6 and a first electrode of the second reset transistor T7 are configured to be electrically connected with a reset control signal line Reset to receive a reset control signal. A second electrode of the second reset transistor T7 is electrically connected with the second electrode of the light emitter 50, and a gate electrode of the second reset transistor T7 is configured to be electrically connected with a reset control signal line Reset to receive a reset control signal. A first electrode of the first light-emitting control transistor T4 is electrically connected with the power supply signal line VDD, a second electrode of the first light-emitting control transistor T4 is electrically connected with the first electrode of the drive transistor T1, and a gate electrode of the first light-emitting control transistor T4 is configured to be electrically connected with a light-emitting control signal line EM to receive a first light-emitting control signal. A first electrode of the second light-emitting control transistor T5 is electrically connected with the second electrode of the drive transistor T1, a second electrode of the second light-emitting control transistor T5 is electrically connected with a second electrode of an organic light-emitting element 220, and a gate electrode of the second light-emitting control transistor T5 is configured to be electrically connected with the light-emitting control signal line EM to receive a second light-emitting control signal. The first electrode of the light emitter 50 is electrically connected with a power supply signal line VSS.

As shown in FIG. 2, the pixel circuit includes a thin film transistor 71. The thin film transistor 71 includes an active layer 711, a gate electrode 712, a first electrode 713 and a second electrode 714. One of the first electrode 713 and the second electrode 714 is a source electrode and the other is a drain electrode. The second electrode 52 of the light emitter 50 is electrically connected with the second electrode 714 of the thin film transistor 71. The first electrode 713 and the second electrode 714 may be disposed in a same layer and formed in one process procedure. The thin film transistor 71 may be the second light-emitting control transistor T5 shown in FIG. 7. The first electrode 51 of the light emitter 50 may be a cathode and the second electrode 52 may be an anode.

As shown in FIG. 2, the pixel circuit further includes a gate insulation layer 81 located at a side of the active layer 711 away from the substrate 10, a first interlayer dielectric layer 82 located at a side of the gate electrode 712 away from the substrate 10, a second interlayer dielectric layer 83 located at a side of the first interlayer dielectric layer 82 away from the substrate 10, a passivation layer 84 located at a side of the first electrode 713 away from the substrate 10, and a protection layer 85 located at a side of the passivation layer 84 away from the substrate 10. The first electrode 713 and the second electrode 714 are partially located on the second interlayer dielectric layer 83, and are electrically connected with the active layer 711 via through holes penetrating through the first interlayer dielectric layer 82, the second interlayer dielectric layer 83 and the gate insulation layer 81. The passivation layer 84 covers the first electrode 713 and the second electrode 714. The second electrode 52 of the light emitter 50 is at least partially located in a through hole penetrating through the protection layer 85.

The display baseplate 100 further includes a power supply signal line located on the substrate 10, where the conductive layer 33 is electrically connected with the power supply signal line. In this case, the conductive layer 33 can reduce the resistance of the power supply signal line and further reduce temperature increase and voltage drop of the power supply signal line, thereby improving the display uniformity of the display baseplate. In some embodiments, the power supply signal line is a low-level power supply signal line. The conductive layer 33 may be electrically connected with the low-level power supply signal line.

In some embodiments, the support columns 60 may be made of a material comprising a conductive material, and an end of the support columns 60 away from the substrate 10 abuts the light-blocking layer 30; the conductive layer 33 is connected with the power supply signal line through the support columns 60. In this case, the support columns 60 may be configured to connect the conductive layer 33 with the power supply signal line without disposing an additional structure for connecting the conductive layer 33 with the power supply signal line, thus helping to reduce the structural complexity of the display baseplate.

In some embodiments, at least one of the support columns 60 is made of a material comprising a conductive material, and the support columns 60 containing the conductive material can have electrical conductivity. In all of the support columns 60 of the display baseplate, some support columns 60 have electrical conductivity and other support columns 60 do not have electrical conductivity. Illustratively, the support columns 60 with electrical conductivity all are made of a conductive material, for example, the support columns 60 all are made of a metal, and the support columns 60 can be formed by sintering. In an embodiment, the support columns 60 may be made of an organic material and conductive particles doped in the organic material, where the conductive particles may include silver nanowires, graphene flakes or the like. In an embodiment, the support columns 60 may be made of an organic material and a conductive material wrapped on the surface of the organic material.

In an embodiment, as shown in FIGS. 1A, 1B, and 2, the display baseplate 100 further includes one or more connection structures 72 located on the substrate 10. The connection structures 72 are configured to connect the first electrodes 51 with the power supply signal line, and the support columns 60 are lapped with the connection structures 72. The disposal of the connection structures 72 facilitates electrical connection between the support columns 60 and the power supply signal line. The power supply signal line may be a low-level power supply signal line.

In an embodiment, the display baseplate 100 further includes one or more electrostatic protection circuits located on the substrate 10, and the conductive layer 33 is electrically connected with the electrostatic protection circuits. In this case, the conductive layer 33 can conduct away a part of the electrostatic current of the electrostatic protection circuits such that the display baseplate can bear a larger electrostatic current, helping to improve the anti-electrostatic capability of the display baseplate.

In an embodiment, each light emitter 50 is electrically connected with one electrostatic protection circuit. In this case, the electrostatic current of each light emitter 50 can be conducted away by a corresponding electrostatic protection circuit, so as to help protect the light emitters 50.

In an embodiment, the conductive layer 33 is connected with the electrostatic protection circuits through the support columns 60. In this case, the support columns 60 can be configured to connect the conductive layer 33 with the electrostatic protection circuits without disposing an additional structure for connecting the conductive layer 33 with the electrostatic protection circuits, thereby helping to reduce the structural complexity of the display baseplate.

In an embodiment, the connection structure 72 is configured to connect the first electrode 51 of the light emitter 50 with the electrostatic protection circuit. That is, The connection structure 72 is electrically connected with the electrostatic protection circuit, the power supply signal line and the first electrode 51 of the light emitter 50, such that the connection structure 72 electrically connects the conductive layer 33 with the power supply signal line and the electrostatic protection circuit respectively, thus helping to reduce the structural complexity of the display baseplate.

In an embodiment, as shown in FIG. 2, the display baseplate 100 further includes one or more connection wires 73 located at a side of the pixel circuits away from the substrate 10, and the connection wires 73 are configured to electrically connect the second electrodes 52 of the light emitters 50 with the pixel circuits. The connection wires 73 and the connection structures 72 may be disposed in a same layer. In this case, the connection wires 73 and the connection structures 72 may be formed in one process procedure, helping to reduce the preparation process complexity of the display baseplate.

The connection wire 73 and the connection structure 72 are partially located between the passivation layer 84 and the protection layer 85, the connection wire 73 is electrically connected with the second electrode 714 of the thin film transistor 71 via a through hole penetrating through the passivation layer 84, and the connection structure 72 is electrically connected with the electrostatic protection circuit via a through hole penetrating through the passivation layer 84. A through hole for exposing a part of the connection structure 72 is opened on the protection layer 85, and the support column 60 is lapped with the connection structure 72 through the through hole.

Figure 9:
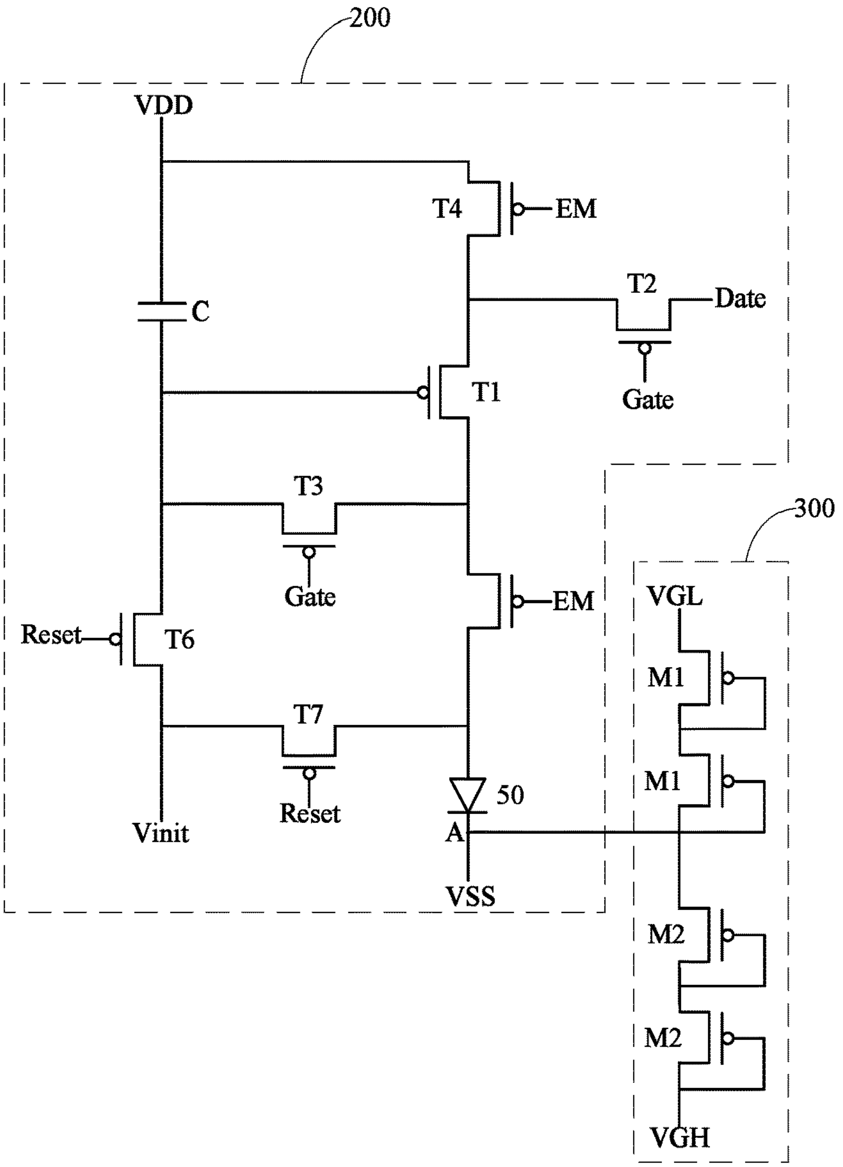
FIG. 9 is a schematic diagram illustrating a pixel circuit and an electrostatic protection circuit of a display baseplate according to another exemplary embodiment of the present disclosure.

In an embodiment, as shown in FIGS. 7 and 9, the electrostatic protection circuit 300 includes at least two thin film transistors, where the electrostatic protection circuit 300 includes at least one first thin film transistor M1 and at least one second thin film transistor M2. The plurality of thin film transistors included in the electrostatic protection circuit 300 are series-connected with each other, and a gate electrode of each of the thin film transistors M1 and M2 is electrically connected with its second electrode. In two adjacent thin film transistors, the first electrode of one thin film transistor is electrically connected with the second electrode of the other thin film transistor. The first electrode of the light emitter 50 is electrically connected with the gate electrode and the first electrode of one first thin film transistor M1, and the second electrode of the first thin film transistor M1 located at end is connected with a low-level end VGL. The second electrode of the second thin film transistor M2 located at end is connected with a high-level end VGH. When the electrostatic protection circuit includes two or more first thin film transistors M1, all of the first thin film transistors M1 are adjacent to each other and series-connected with each other; when the electrostatic protection circuit includes two or more second thin film transistors M2, all of the second thin film transistors M2 are adjacent to each other and series-connected with each other.

The electrostatic protection circuit 300 shown in FIG. 7 includes one first thin film transistor M1 and one second thin film transistor M2, and the electrostatic protection circuit 300 shown in FIG. 9 includes two first thin film transistors M1 and two second thin film transistors M2. In other embodiments, the electrostatic protection circuit includes more than two first thin film transistors M1 and more than two second thin film transistors M2. The more thin film transistors that the electrostatic protection circuit includes, the better the electrostatic protection capability is. In some embodiments, when the size of the light emitter is small, more thin film transistors may be disposed in the electrostatic protection circuit to increase the anti-electrostatic capability. When the size of the light emitter is large, less thin film transistors may be disposed in the electrostatic protection circuit to reduce the space occupied by the electrostatic protection circuit, and increase the density of the light emitters.

With the thin film transistors M1 and M2 included in the electrostatic protection circuit as P type transistors, the working principle of the electrostatic protection circuit will be described below. During operation of the light emitters, since a potential of the high-level end VGH is higher than a potential of the low-level end VGL, each thin film transistor of the electrostatic protection circuit is in a cutoff state. When the light emitter does not work, if a potential of the first electrode of the light emitter is greater than the potential of the high-level end VGH, the high-level end VGH enables the thin film transistors M1 and M2 of the electrostatic protection circuit to be conducted, and the electrostatic charges of the first electrode are conducted away through the high-level end VGH; if the potential of the first electrode of the light emitter is less than the potential of the low-level end VGL, the potential of the first electrode enables the first thin film transistor M1 of the electrostatic protection circuit to be conducted and the second thin film transistor M2 to be cut off, and the electrostatic charges of the first electrode are conducted away through the low-level end VGL.

Figure 8:
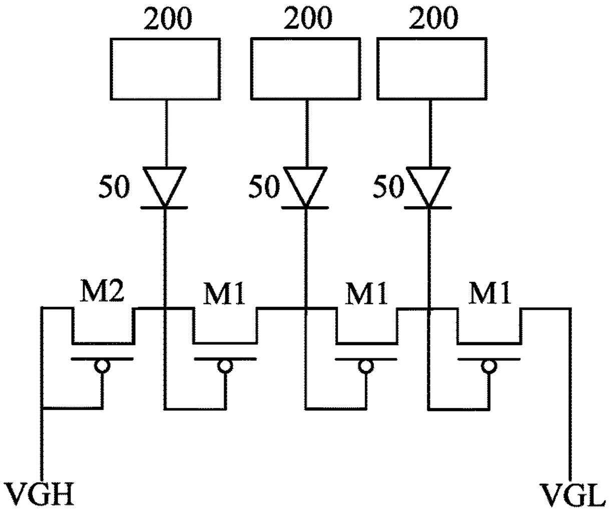
FIG. 8 is a schematic diagram illustrating a plurality of electrostatic protection circuits series-connected with each other in the circuit shown in FIG. 7.
Figure 10:
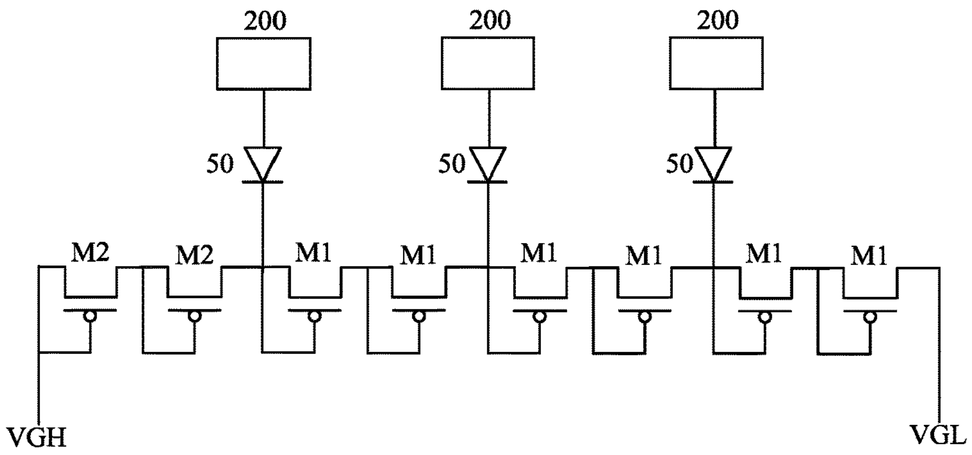
FIG. 10 is a schematic diagram illustrating a plurality of electrostatic protection circuits series-connected with each other in the circuit shown in FIG. 9.

As shown in FIGS. 8 and 10, the thin film transistors of adjacent electrostatic protection circuits are series-connected with each other and the series-connected plural electrostatic protection circuits share the second thin film transistor M2. Further, after the plural electrostatic protection circuits are series-connected with each other, the structural complexity of the electrostatic protection circuits can be reduced.

As shown in FIG. 2, the electrostatic protection circuit includes thin film transistors 74, 75. The thin film transistor 74 includes an active layer 741, a gate electrode 742, a first electrode 743 and a second electrode 744, where the gate electrode 742 and the second electrode 744 are electrically connected with each other. The thin film transistor 75 includes an active layer 751, a gate electrode 752, a first electrode 753 and a second electrode 754, where the gate electrode 752 and the second electrode 754 are electrically connected with each other. Furthermore, the second electrode 744 of the thin film transistor 74 is electrically connected with the first electrode 753 of the thin film transistor 75. The connection structure 72 is electrically connected with the second electrode 744 of the thin film transistor 74. The thin film transistor 74 may be the first thin film transistor M1 shown in FIGS. 7 to 10, and the thin film transistor 75 may be the first thin film transistor M1 or the second thin film transistor M2 shown in FIGS. 7 to 10.

In an embodiment, the second electrode 744 of the thin film transistor 74 is connected with the first electrode 753 of the adjacent thin film transistor 75 through a connection portion 76. The connection portions 76 may be disposed in the same layer as the first electrode of each thin film transistor and formed in the same process as the first electrode of each thin film transistor, so as to simplify the preparation process.

As shown in FIGS. 7 and 9, the first electrode of the light emitter 50 is connected with the power supply signal line VSS at a connection point A, and the electrostatic protection circuit 300 is connected with the first electrode of the light emitter 50 at the connection point A. The connection point A may be the connection structure 72 shown in FIG. 2, and the support column 60 is lapped with the connection structure 72.

In an embodiment, the conductive layer 33 of the light-blocking layer 30 has a thickness of 300 nm to 1000 nm. In this case, it is avoided that the light-blocking layer 30 is highly stressed due to large thickness of the conductive layer 33, leading to warping and hence separation from other film layers. Also, the problem that the small thickness and large resistance of the light-blocking layer 30 is unfavorable for reduction of voltage drop of the power supply signal line and improvement of the anti-electrostatic capability of the display baseplate can be avoided. In some embodiments, the thickness of the conductive layer 33 may be, for example, 300 nm, 500 nm, 700 nm, 900 nm, 1000 nm or the like.

Figure 11:
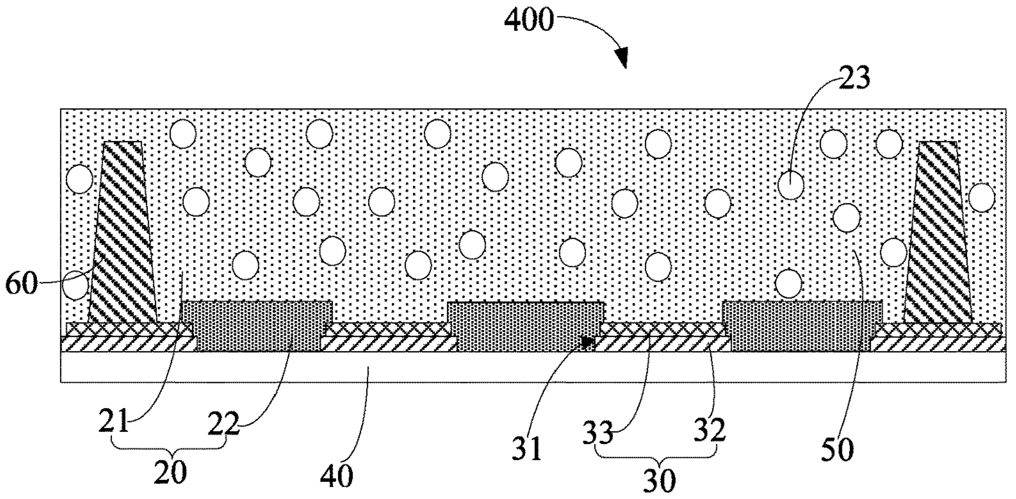
FIG. 11 is a partial sectional view illustrating an encapsulation baseplate according to an exemplary embodiment of the present disclosure.

Embodiments of the present disclosure further provide an encapsulation baseplate, where the encapsulation baseplate is used to prepare the display baseplate of any one of the above embodiments. As shown in FIG. 11, the encapsulation baseplate 400 includes an encapsulation cover plate 40, a light-blocking layer 30 located at a side of the encapsulation cover plate 40, and a light-transmitting layer 20 located at a side of the encapsulation cover plate 40. The light-blocking layer 30 is provided with a plurality of holes 31, and the light-transmitting layer 20 covers the light-blocking layer 30 and partially is filled in the holes 31.

In an embodiment, the light-transmitting layer 20 includes a first light-transmitting film layer 21 and a second light-transmitting film layer 22 located at a side of the first light-transmitting film layer 21 facing toward the encapsulation cover plate 40, the second light-transmitting film layer 22 fills the holes 31, and a light transmittance of the second light-transmitting film layer 22 is less than a light transmittance of the first light-transmitting film layer 21.

In an embodiment, the encapsulation baseplate 400 further includes scattering particles dispersed in the light-transmitting layer 20.

In an embodiment, the encapsulation baseplate 400 further includes one or more support columns 60 disposed inside the light-transmitting layer 20, and an end of the support columns 60 facing toward the encapsulation cover plate 40 abuts the light-blocking layer 30; an orthographic projection of the support columns 60 on the encapsulation cover plate 40 is located within an orthographic projection of the light-blocking layer 30 on the encapsulation cover plate 40.

In an embodiment, the light-blocking layer 30 includes a conductive layer 33, the support columns 60 may be made of a material comprising a conductive material, and the support columns 60 are electrically connected with the conductive layer 33.

In an embodiment, the light-blocking layer 30 includes a light adjustment layer 32, and the conductive layer 33 is located at a side of the light adjustment layer 32 away from the encapsulation cover plate 40. An orthographic projection of the conductive layer 33 on the encapsulation cover plate 40 is located within an orthographic projection of the light adjustment layer 32 on the encapsulation cover plate 40.

In an embodiment, a distance between an edge of the orthographic projection of the conductive layer 33 on the encapsulation cover plate 40 and an edge of the orthographic projection of the light adjustment layer 32 on the encapsulation cover plate 40 is in a range of 1 μm to 5 μm.

In an embodiment, a ratio between a thickness of the light adjustment layer 32 and a thickness of the second light-transmitting film layer 22 is in a range of 1:1 to 1:2.

In an embodiment, the thickness of the light adjustment layer 32 is in a range of 1.5 μm to 3 μm.

In an embodiment, the thickness of the conductive layer 33 is in a range of 300 nm to 1000 nm.

Embodiments of the present disclosure further provide a method of preparing an encapsulation baseplate, which includes the following steps.

Firstly, an encapsulation cover plate is provided.

Next, a light adjustment layer is formed on the encapsulation cover plate, where the light adjustment layer is provided with first sub-holes arranged in a spacing.

Figure 12:
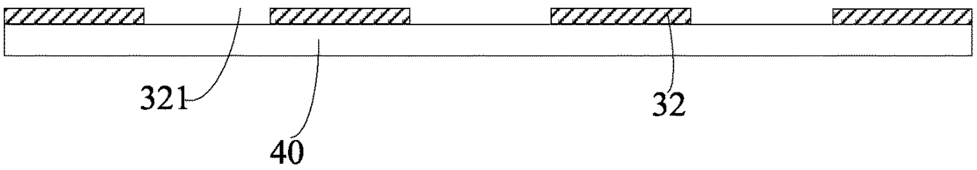
FIG. 12 is a partial sectional view of a first intermediate structure of an encapsulation baseplate according to an exemplary embodiment of the present disclosure.
Figure 13:
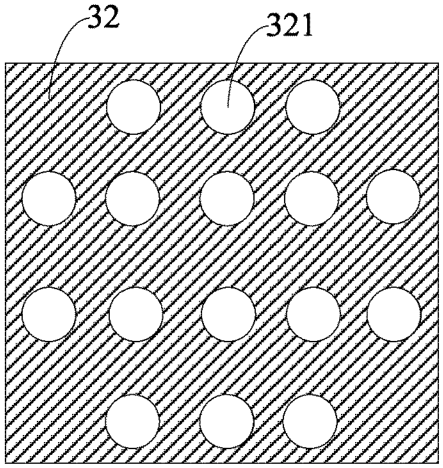
FIG. 13 is a partial top view of a first intermediate structure of an encapsulation baseplate according to an exemplary embodiment of the present disclosure.

Based on the step, a first intermediate structure shown in FIGS. 12 and 13 can be obtained. As shown in FIGS. 12 and 13, the light adjustment layer 32 is provided with a plurality of first sub-holes 321.

A photoresist material is firstly coated on the encapsulation cover plate, and then, a photolithography process is performed on the encapsulation cover plate to form the first sub-holes 321 so as to form the light adjustment layer 32. In this way, the light adjustment layer 32 can be prepared accurately, and an edge of the light adjustment layer 32 is basically flush with an edge of the encapsulation cover plate.

Next, a conductive layer is formed on the light adjustment layer to obtain a light-blocking layer including the conductive layer and the light adjustment layer; the conductive layer is provided with a plurality of second sub-holes arranged in a spacing, where an orthographic projection of each second sub-hole on the encapsulation cover plate 40 is located within an orthographic projection of one first sub-hole on the encapsulation cover plate 40.

Figure 14:
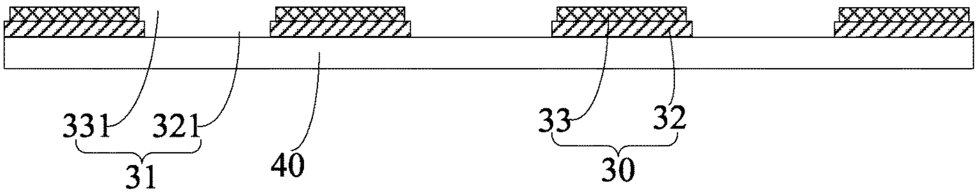
FIG. 14 is a partial sectional view of a second intermediate structure of an encapsulation baseplate according to an exemplary embodiment of the present disclosure.
Figure 15:
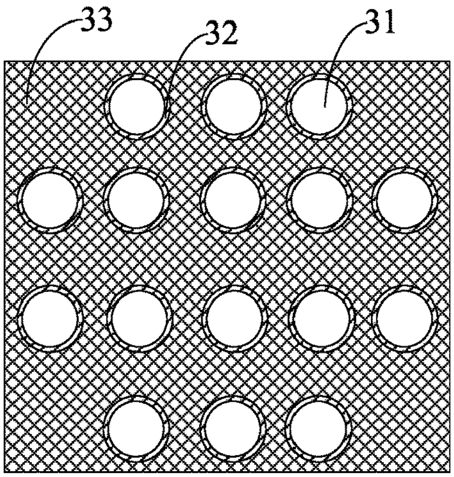
FIG. 15 is a partial top view of a second intermediate structure of an encapsulation baseplate according to an exemplary embodiment of the present disclosure.

Based on this step, a second intermediate structure shown in FIGS. 14 and 15 can be obtained. As shown in FIGS. 14 and 15, the second sub-holes 331 of the conductive layer 33 is in one-to-one correspondence with the first sub-holes 321, and the orthographic projection of each second sub-hole 331 on the encapsulation cover plate 40 is located within the orthographic projection of a corresponding first sub-hole 321 on the encapsulation cover plate 40. Further, an edge of the orthographic projection of each second sub-hole 331 on the encapsulation cover plate 40 is located within an edge of the orthographic projection of the corresponding first sub-hole 321 on the encapsulation cover plate 40. The second sub-hole 331 and the corresponding first sub-hole 321 form the hole 31.

Next, a light-transmitting layer and one or more support columns inside the light-transmitting layer are formed on the encapsulation cover plate, where scattering particles are doped in the light-transmitting layer; the light-transmitting layer covers the light-blocking layer and partially is filled in the holes; an orthographic projection of the support columns on the encapsulation cover plate is located within the orthographic projection of the light-blocking layer on the encapsulation cover plate.

In an embodiment, the light-transmitting layer includes a first light-transmitting film layer and a second light-transmitting film layer, where the first light-transmitting film layer is located at a side of the second light-transmitting film layer away from the encapsulation cover plate; a light transmittance of the second light-transmitting film layer is less than a light transmittance of the first light-transmitting film layer. The step of forming the light-transmitting layer and the support columns on the encapsulation cover plate may include the following sub-steps.

Figure 16:
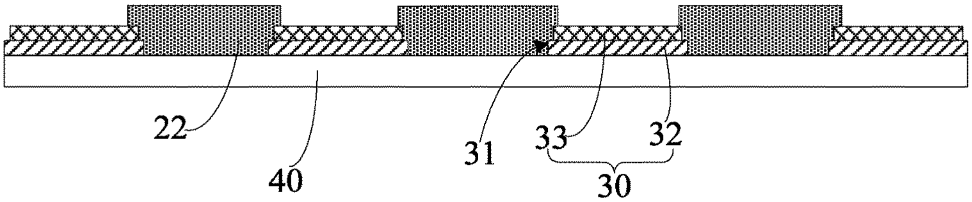
FIG. 16 is a partial sectional view of a third intermediate structure of an encapsulation baseplate according to an exemplary embodiment of the present disclosure.
Figure 17:
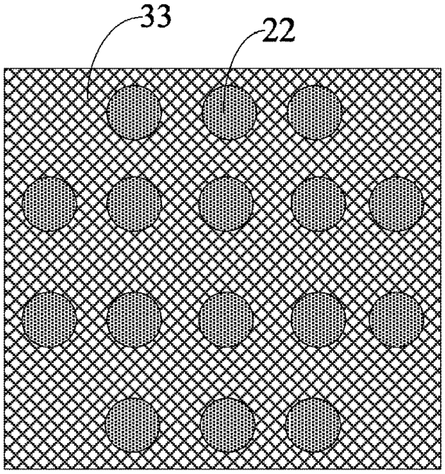
FIG. 17 is a partial top view of a third intermediate structure of an encapsulation baseplate according to an exemplary embodiment of the present disclosure.

Firstly, the second light-transmitting film layer is formed and filled in the holes. Based on this sub-step, a third intermediate structure shown in FIGS. 16 and 17 can be obtained. As shown in FIGS. 16 and 17, the second light-transmitting film layer 22 completely fills all the holes 31, and the second light-transmitting film layer 22 can cover a partial surface of the light adjustment layer 32.

Figure 18:
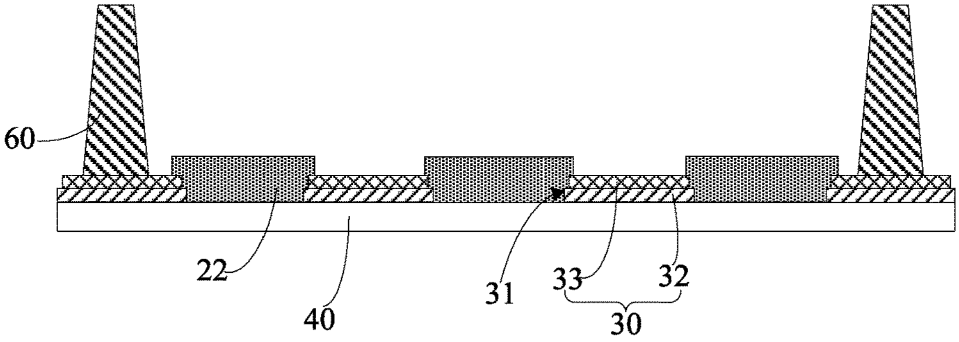
FIG. 18 is a partial sectional view of a fourth intermediate structure of an encapsulation baseplate according to an exemplary embodiment of the present disclosure.
Figure 19:
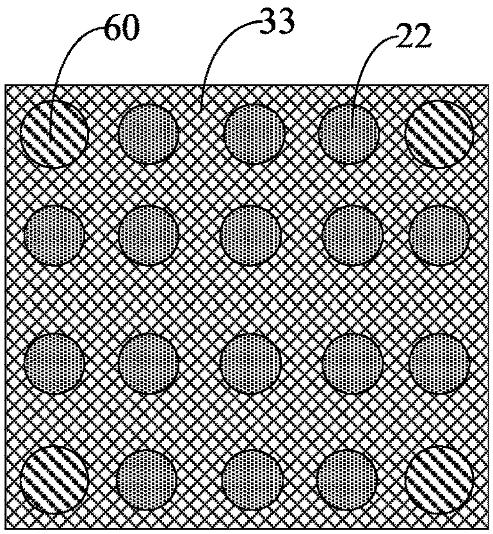
FIG. 19 is a partial top view of a fourth intermediate structure of an encapsulation baseplate according to an exemplary embodiment of the present disclosure.

Then, support columns are formed on the light-blocking layer. Based on this sub-step, a fourth intermediate structure shown in FIGS. 18 and 19 can be obtained. As shown in FIGS. 18 and 19, the orthographic projection of the support columns 60 on the encapsulation cover plate 40 is located within the orthographic projection of the light-blocking layer on the encapsulation cover plate 40.

Then, the first light-transmitting film layer is formed, and scattering particles are doped in the first light-transmitting film layer. The first light-transmitting film layer covers the support columns, the light-blocking layer and the second light-transmitting film layer. Based on this sub-step, the encapsulation baseplate shown in FIG. 11 can be obtained. As shown in FIG. 11, the thickness of the first light-transmitting film layer 21 may be greater than that of the support columns 60. Firstly, scattering particles 23 may be doped in the material of the first light-transmitting film layer 21 and then the material doped with the scattering particles 23 is coated on the support columns, the light-blocking layer and the second light-transmitting film layer to form the first light-transmitting film layer.

Embodiments of the present disclosure further provide a method of preparing a display baseplate. The method includes the following process.

Firstly, an encapsulation baseplate and a display backplate are provided.

The encapsulation baseplate is the encapsulation baseplate of any one of the above embodiments, and the display backplate includes a substrate, a drive circuit layer located on the substrate and one or more light emitters located on the drive circuit layer.

Next, the encapsulation baseplate and the display backplate are aligned and assembled together, the light-transmitting layer of the encapsulation baseplate faces toward the light emitters, such that the light emitters are embedded into the light-transmitting layer. Further, the support columns are lapped with the connection structures of the drive circuit layer, and curing treatment is performed on the light-transmitting layer.

Based on this step, the display baseplate shown in FIG. 2 can be obtained.

Figure 20:
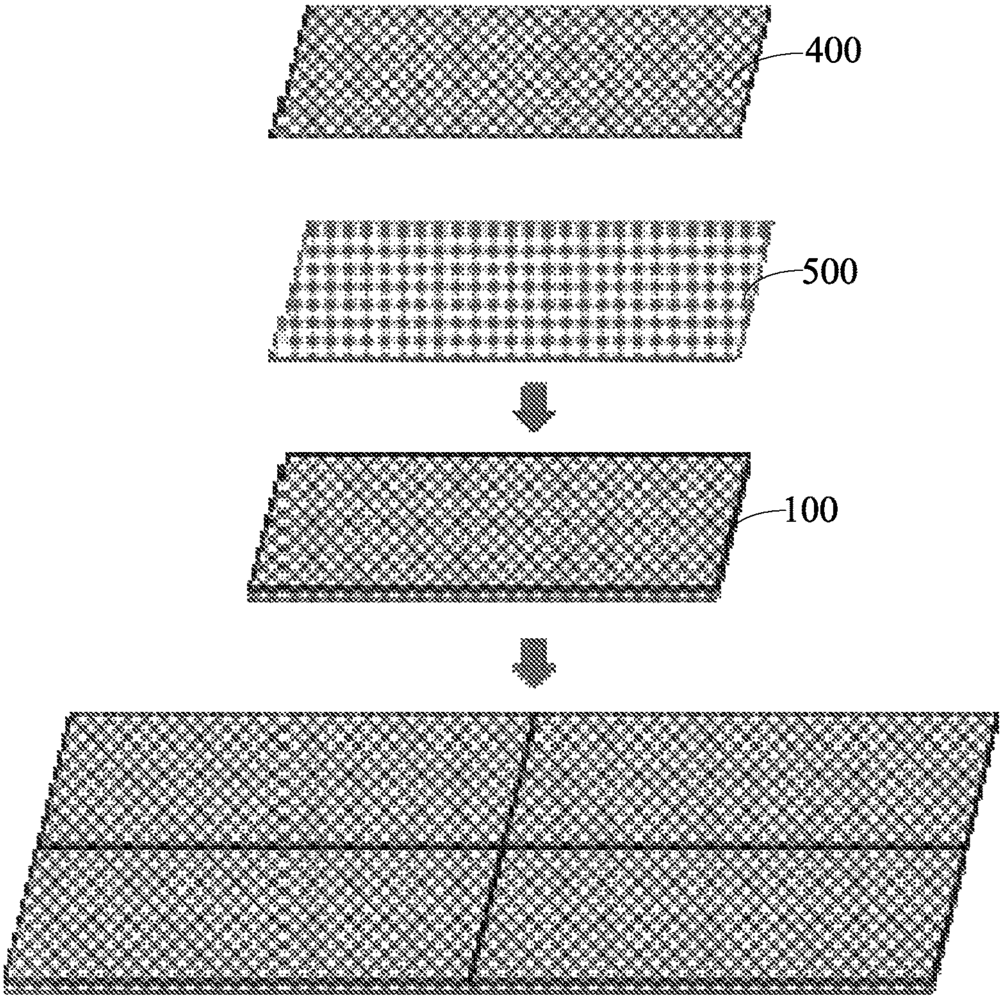
FIG. 20 is a structural schematic diagram obtained in a preparation process of a splicing screen according to an exemplary embodiment of the present disclosure.

Embodiments of the present disclosure further provide a method of preparing a splicing screen. As shown in FIG. 20, the method includes the following process.

Firstly, an encapsulation baseplate and a display backplate are provided.

The encapsulation baseplate 400 substantially has the same size as the display backplate 500. The encapsulation baseplate is the encapsulation baseplate of any one of the above embodiments.

Next, the encapsulation baseplate and the display backplate are aligned and assembled together to obtain the display baseplate 100.

Next, a splicing screen is obtained by splicing a plurality of display baseplates.

In the method of preparing a splicing screen according to the embodiments of the present disclosure, the light adjustment layer of the encapsulation baseplate is prepared accurately, and the edge of the light adjustment layer is basically flush with the edge of the encapsulation cover plate. Thus, the splicing accuracy of the splicing screen is only affected by the aligning accuracy at the time of splicing, and hence, the splicing screen has a small splicing seam.

In a solution, the light adjustment layer of the display baseplate is an entire surface of black film attached thereon, which has low attaching accuracy and cutting accuracy. Further, to avoid light leakage of the splicing seam of the splicing screen, an edge of the black film of the display baseplate generally exceeds the edge of the encapsulation cover plate, and the black films of adjacent display baseplates in the splicing screen are overlapped to prevent light leakage of the splicing seam. The splicing screen obtained based on this solution may have a large splicing seam; further, since the black film is attached to the display baseplate by an adhesive layer, the adhesive layer may drive the black film to deform when the temperature is high, thus affecting the display effect of the display baseplate. Compared with the solution, the splicing screen obtained in the method of preparing a splicing screen according to the embodiments of the present disclosure has a small splicing seam which may be only several microns, helping to improve the user experiences. Moreover, the light adjustment layer is made of a material comprising a photoresist material and can bear a high temperature and is difficult to deform.

Figure 21:
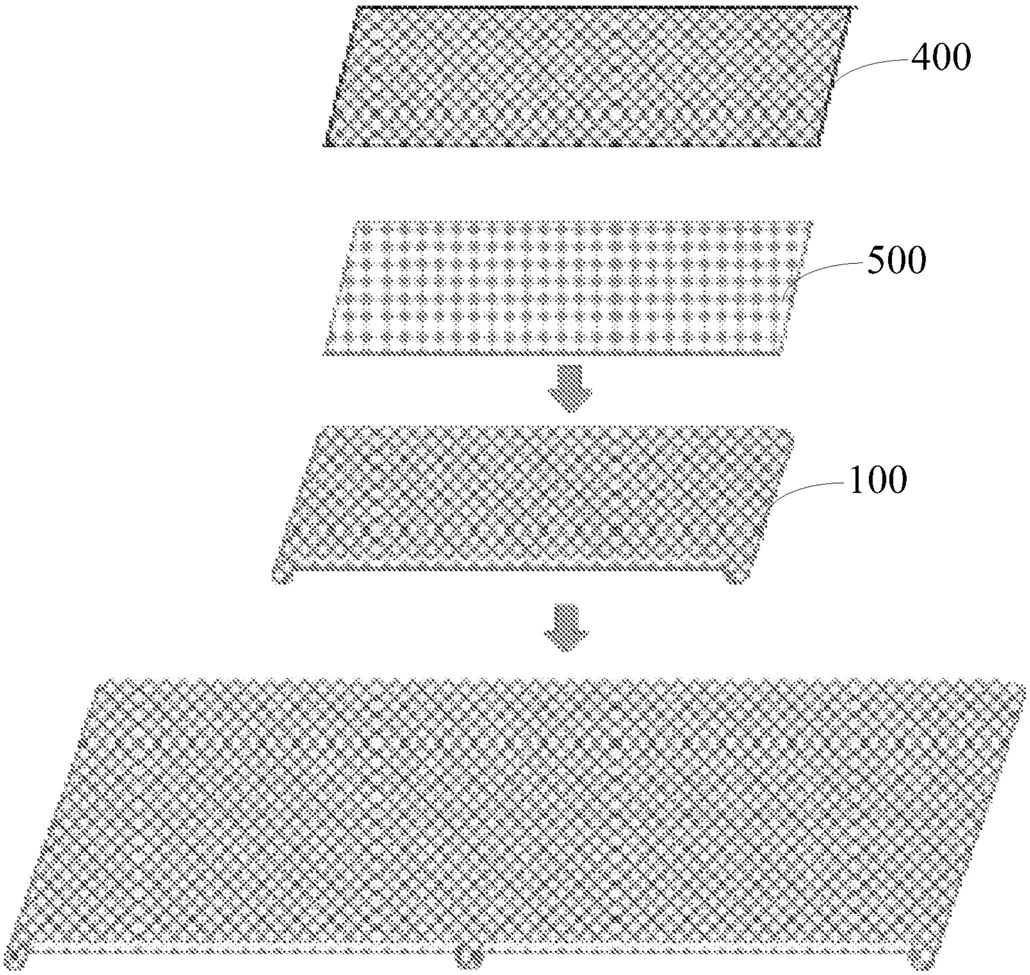
FIG. 21 is a structural schematic diagram obtained in a preparation process of a splicing screen according to another exemplary embodiment of the present disclosure.

Embodiments of the present disclosure further provide another method of preparing a splicing screen. As shown in FIG. 21, the method includes the following process.

Firstly, an encapsulation baseplate and a display backplate are provided.

The size of the encapsulation baseplate 400 is slightly greater than that of the display backplate. The encapsulation baseplate is the encapsulation baseplate of any one of the above embodiments. The encapsulation baseplate is a flexible encapsulation baseplate.

Next, the encapsulation baseplate and the display backplate are aligned and assembled together to form a display baseplate, where the edge of the encapsulation baseplate bends toward the substrate of the display backplate to wrap the side portions of the display backplate.

Next, a plurality of display baseplates are spliced to obtain a splicing screen.

Figure 22:
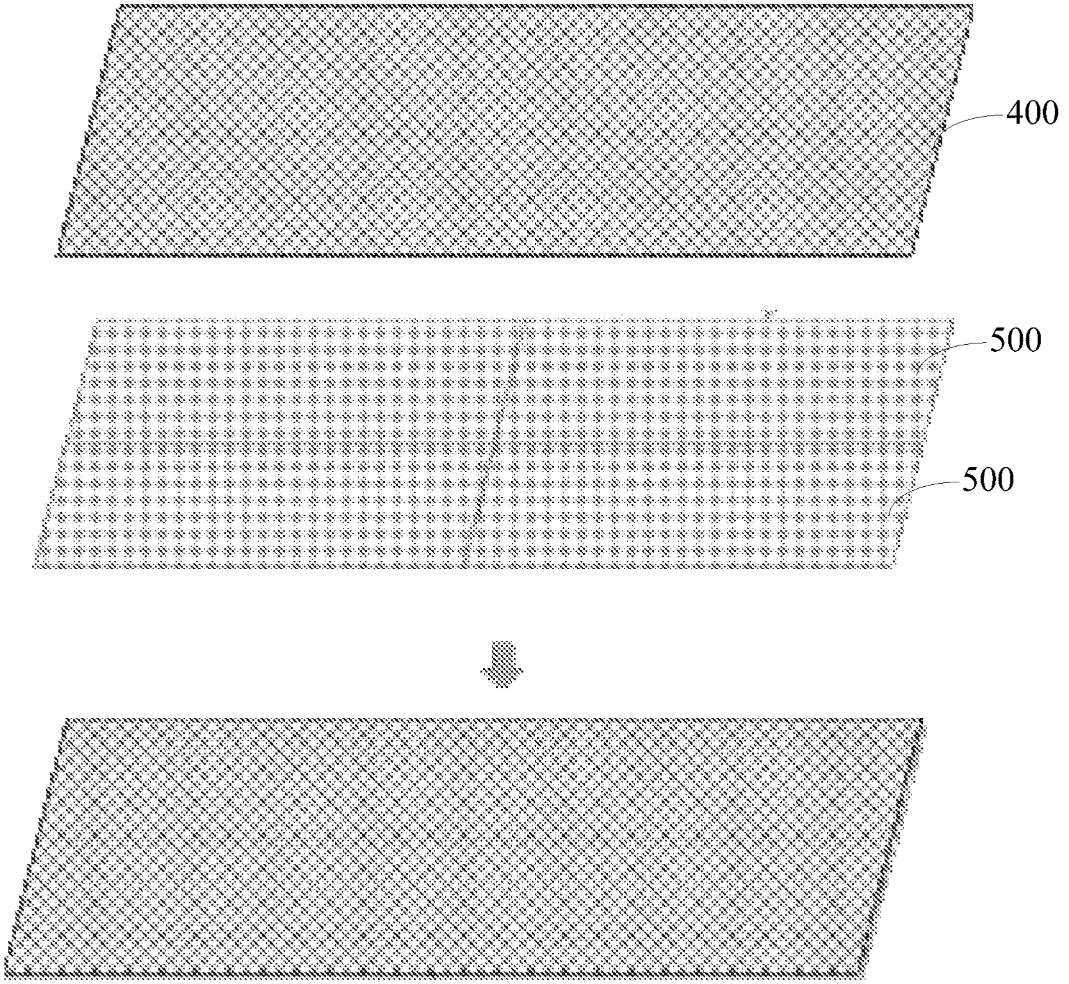
FIG. 22 is a structural schematic diagram obtained in a preparation process of a splicing screen according to yet another exemplary embodiment of the present disclosure.
Figure 23:
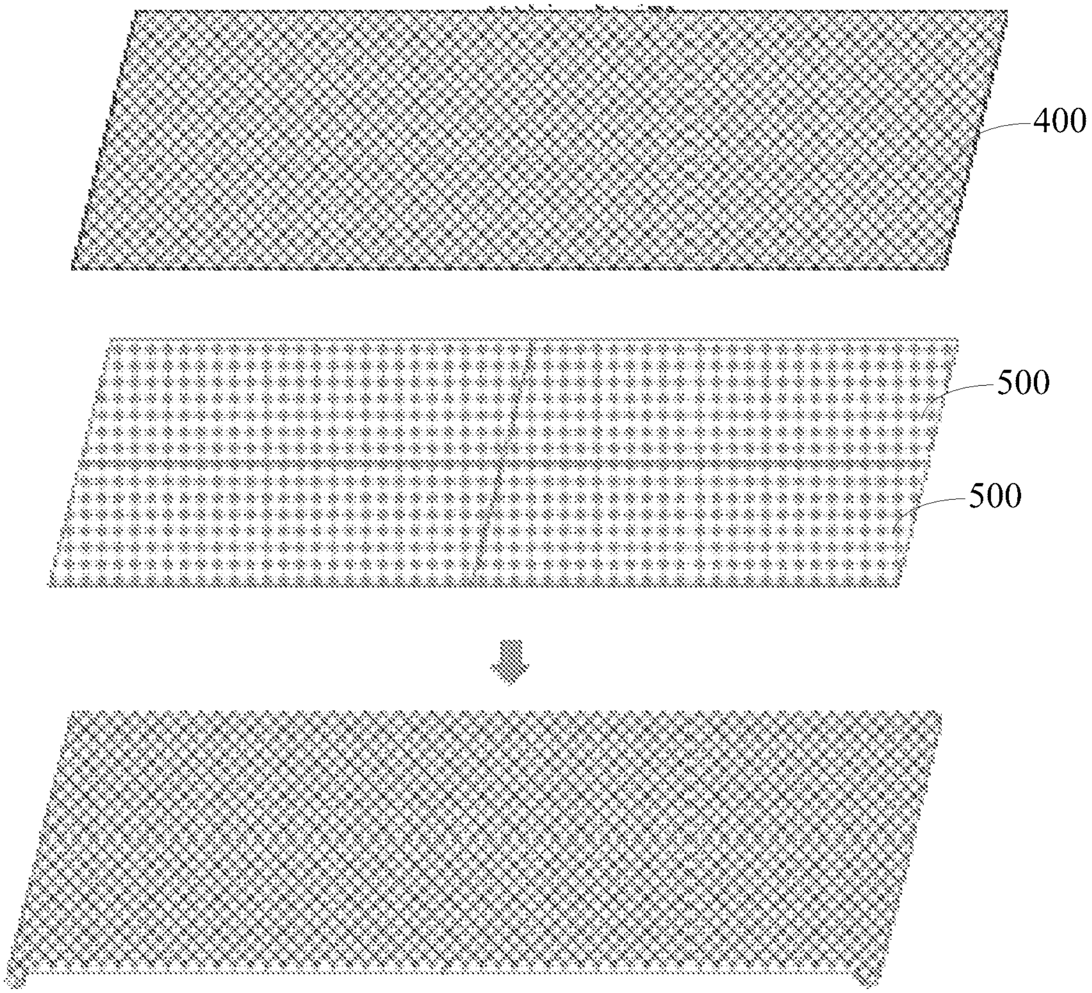
FIG. 23 is a structural schematic diagram obtained in a preparation process of a splicing screen according to still another exemplary embodiment of the present disclosure.

Embodiments of the present disclosure further provide another method of preparing a splicing screen. As shown in FIGS. 22 and 23, the method includes the following process.

Firstly, an encapsulation baseplate and a display backplate are provided.

The size of the encapsulation baseplate 400 is greater than that of the display backplate 500. The size of the encapsulation baseplate 400 is substantially equal to a sum of the sizes of a plurality of display backplates. The encapsulation baseplate is the encapsulation baseplate of any one of the above embodiments.

Next, a plurality of display backplates 500 are spliced to obtain a splicing display backplate.

Next, the encapsulation baseplate and the splicing display backplate are aligned and assembled together to obtain a splicing screen.

As shown in FIG. 22, the encapsulation baseplate may be a flexible encapsulation baseplate. After the encapsulation baseplate and the splicing display backplate are aligned and assembled together, the edge of the encapsulation baseplate may bend toward the splicing display backplate to wrap the side portions of the splicing display backplate.

Embodiments of the present disclosure provide a display apparatus including the display baseplate of any one of the above embodiments.

The display apparatus may be any appropriate display apparatus which includes but not limited to any product or component having display function, such as a smart phone, a tablet computer, a television, a display, a laptop computer, a digital photo frame, a navigator, an electronic book and the like.

It should be noted that in the accompanying drawings, for illustration clarity, the sizes of the layers and regions may be exaggerated. Furthermore, it may be understood that when an element or layer is referred to as being "on" another element or layer, such element or layer may be directly on the another element or layer or there is an intermediate layer therebetween. Further, it is understood that when an element or layer is referred to as being "under" another element or layer, such element or layer may be directly under the another element or layer, or one or more intermediate elements or layers are present therebetween. In addition, it may also be understood that when a layer or element is referred to as being between two layers or elements, such layer or element may be a sole layer between the two layers or elements, or one or more intermediate layers or elements are present therebetween. Like reference signs in the descriptions indicate like elements.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A display baseplate, comprising:

a substrate;

one or more light-emitting unit groups on the substrate, wherein each of the light-emitting unit groups comprises a plurality of light emitters;

a light-blocking layer on the substrate, wherein the light-blocking layer comprises a plurality of holes, and an orthographic projection of the light emitters onto the substrate is completely within an orthographic projection of the holes onto the substrate; wherein the light-blocking layer is at a side of the light-emitting unit groups away from the substrate;

a light-transmitting layer on the substrate, wherein the light-transmitting layer covers the light emitters, the light-transmitting layer is partially between the light-blocking layer and the substrate and partially in the holes; and an encapsulation cover plate at a side of the light-blocking layer away from the substrate;

wherein the light-blocking layer comprises a conductive layer, the display baseplate further comprises a power supply signal line or one or more electrostatic protection circuits on the substrate, the conductive layer is electrically connected with the power supply signal line or the electrostatic protection circuits, and each of the light emitters is electrically connected with one of the electrostatic protection circuits;

wherein the display baseplate further comprises one or more support columns inside the light-transmitting layer, wherein at least one of the support columns comprises a conductive material, and an end of the at least one support column away from the substrate abuts the light-blocking layer; and the conductive layer is connected with the power supply signal line or the electrostatic protection circuits through the at least one support column.

2. The display baseplate of claim 1, wherein, an orthographic projection of each of the light-emitting unit groups onto the substrate is completely within an orthographic projection of one of the holes onto the substrate; or, an orthographic projection of each of the light emitters onto the substrate is completely within an orthographic projection of one of the holes onto the substrate.

3. The display baseplate of claim 1, wherein an orthographic projection of the light-transmitting layer onto the substrate covers an orthographic projection of the light-blocking layer onto the substrate.

4. The display baseplate of claim 1, wherein the light-transmitting layer comprises a first light-transmitting film layer and a second light-transmitting film layer at a side of the first light-transmitting film layer away from the substrate, the second light-transmitting film layer fills the holes, and a light transmittance of the second light-transmitting film layer is less than a light transmittance of the first light-transmitting film layer; and an orthographic projection of the second light-transmitting film layer onto the substrate covers the orthographic projection of the light emitters onto the substrate.

5. The display baseplate of claim 4, wherein the light-blocking layer comprises a conductive layer and a light adjustment layer at a side of the conductive layer away from the substrate, an orthographic projection of the conductive layer onto the substrate is within an orthographic projection of the light adjustment layer onto the substrate; and a ratio between a thickness of the light adjustment layer and a thickness of the second light-transmitting film layer is in a range of 1:1 to 1:2.

6. The display baseplate of claim 5, wherein, when an orthographic projection of each of the light-emitting unit groups onto the substrate is completely within an orthographic projection of one of the holes onto the substrate, a thickness of the light adjustment layer is a first thickness;

when an orthographic projection of each of the light emitters onto the substrate is completely within an orthographic projection of one of the holes onto the substrate, a thickness of the light adjustment layer is a second thickness; and the first thickness is greater than the second thickness.

7. The display baseplate of claim 5, wherein a distance between an edge of the orthographic projection of the conductive layer onto the substrate and an edge of the orthographic projection of the light adjustment layer onto the substrate is in a range of 1 μm to 5 μm; or, a thickness of the light adjustment layer is in a range of 1.5 μm to 3 μm.

8. The display baseplate of claim 1, wherein an orthographic projection of the support columns onto the substrate is within an orthographic projection of the light-blocking layer onto the substrate.

9. The display baseplate of claim 1, further comprising one or more connection structures on the substrate, wherein the light emitters comprise respective first electrodes, the connection structures are configured to connect the first electrodes with the power supply signal line or the electrostatic protection circuits, and the support columns are lapped with the connection structures.

10. The display baseplate of claim 9, further comprising one or more pixel circuits and one or more connection wires at a side of the pixel circuits away from the substrate, wherein the light emitters comprise respective second electrodes, the connection wires connect the second electrodes with the pixel circuits; and the connection wires and the connection structures are in a same layer.

11. The display baseplate of claim 1, wherein each of the electrostatic protection circuits comprises one or more thin film transistors, and the thin film transistors of adjacent electrostatic protection circuits are series-connected with each other.

12. The display baseplate of claim 1, wherein the light-transmitting layer comprises a plurality of light-transmitting portions, and each of the light-transmitting portions wraps two or more of the light emitters in one of the light-emitting unit groups.

13. The display baseplate of claim 1, further comprising scattering particles dispersed in the light-transmitting layer.

* * * * *